US012563760B2

(12) United States Patent
Bothe et al.

(10) Patent No.: US 12,563,760 B2
(45) Date of Patent: Feb. 24, 2026

(54) FIELD REDUCING STRUCTURES FOR NITROGEN-POLAR GROUP III-NITRIDE SEMICONDUCTOR DEVICES

(71) Applicant: Wolfspeed, Inc., Durham, NC (US)

(72) Inventors: Kyle Bothe, Cary, NC (US); Chris Hardiman, Cary, NC (US); Scott Sheppard, Chapel Hill, NC (US)

(73) Assignee: WOLFSPEED, INC., Durham, NC (US)

( * ) Notice: Subject to any disclaimer, the term of this patent is extended or adjusted under 35 U.S.C. 154(b) by 408 days.

(21) Appl. No.: 18/179,070

(22) Filed: Mar. 6, 2023

(65) Prior Publication Data

US 2024/0304702 A1 Sep. 12, 2024

(51) Int. Cl.
| | |
|---|---|
| *H01L 29/66* | (2006.01) |
| *H10D 30/01* | (2025.01) |
| *H10D 30/47* | (2025.01) |
| *H10D 62/85* | (2025.01) |
| *H10D 64/00* | (2025.01) |
| *H10D 64/23* | (2025.01) |
| *H10D 64/27* | (2025.01) |

(52) U.S. Cl.
CPC ......... *H10D 30/015* (2025.01); *H10D 30/475* (2025.01); *H10D 62/8503* (2025.01); *H10D 64/111* (2025.01); *H10D 64/251* (2025.01); *H10D 64/511* (2025.01)

(58) Field of Classification Search
None
See application file for complete search history.

(56) References Cited

U.S. PATENT DOCUMENTS

| | | | |
|---|---|---|---|
| 4,946,547 | A | 8/1990 | Palmour et al. |
| 5,200,022 | A | 4/1993 | Kong et al. |
| 5,210,051 | A | 5/1993 | Carter, Jr. |
| RE34,861 | E | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter, Jr. et al. |
| 7,045,404 | B2 | 5/2006 | Sheppard et al. |
| 8,049,252 | B2 | 11/2011 | Smith et al. |
| 8,120,064 | B2 | 2/2012 | Parikh et al. |
| 8,563,372 | B2 | 10/2013 | Hagleitner et al. |
| 8,592,867 | B2 | 11/2013 | Wu et al. |
| 8,664,695 | B2 | 3/2014 | Wu et al. |
| 8,823,057 | B2 | 9/2014 | Sheppard et al. |

(Continued)

OTHER PUBLICATIONS

Akyol, "N-Polar III-Nitride Optoelectronic Devices", Ohio State University, Master's thesis, 2011, 58 pages.

(Continued)

*Primary Examiner* — William C Trapanese
(74) *Attorney, Agent, or Firm* — Dority & Manning, P.A.

(57) ABSTRACT

Field reducing structures for transistor devices having Group III-nitride semiconductor structures are provided. In one example, a transistor device includes a nitrogen-polar (N-polar) Group III-nitride semiconductor structure. The transistor device includes a source contact, a drain contact, and a gate contact. The transistor device includes a field reducing structure operable to reduce an electric field in a region in the N-polar Group III-nitride semiconductor structure between the gate contact and the drain contact.

19 Claims, 12 Drawing Sheets

(56)　　　References Cited

U.S. PATENT DOCUMENTS

| | | | |
|---|---|---|---|
| 8,933,486 B2 | 1/2015 | Wu | |
| 9,214,352 B2 | 12/2015 | Hagleitner et al. | |
| 9,984,881 B2 | 5/2018 | Sheppard et al. | |
| 11,075,271 B2 | 7/2021 | Jones et al. | |
| 11,502,178 B2 | 11/2022 | Bothe et al. | |
| 2006/0202272 A1 | 9/2006 | Wu et al. | |
| 2012/0267636 A1 | 10/2012 | Zundel et al. | |
| 2013/0193485 A1 | 8/2013 | Akiyama et al. | |
| 2017/0365670 A1 | 12/2017 | Wu et al. | |
| 2020/0119179 A1* | 4/2020 | Mishra | H10D 30/477 |
| 2021/0111254 A1 | 4/2021 | Jones et al. | |
| 2022/0302291 A1 | 9/2022 | Guo et al. | |
| 2022/0328634 A1 | 10/2022 | Bothe et al. | |

OTHER PUBLICATIONS

Hussain, "Structural and Optical Characterization of Green-Yellow Light Emitting Devices with High Indium Concentrated (In,Ga)N Quantum Wells", Hyper Articles en Ligne (HAL), Dec. 2014, 193 pages.

Romanczyk et al., "N-Polar GaN-on-Sapphire Deep Recess HEMTs with High W-Band Power Density", IEEE Electron Device Letters, vol. 41, No. 11, Nov. 2020, pp. 1633-1636.

Wong et al., "N-Polar GaN Epitaxy and High Electron Mobility Transistors", IOP Publishing, Semiconductor Science and Technology, vol. 28, No. 074009, 2013, 22 pages.

Zhang et al., "On the Polarity Determination and Polarity Inversion in Nitrogen-Polar Group III-Nitride Layers Grown on SiC", Journal of Applied Physics, vol. 131, No. 055701, 2022, 9 pages.

International Search Report and Written Opinion for Application No. PCT/US2024/017593, mailed Sep. 2, 2024, 21 pages.

Kolluri et al., "RF Performance of N-Polar AlGaN/GaN MIS-HEMTs Grown by MOCVD on Sapphire Substrate", IEEE Electron Device Letters, vol. 30, No. 6, Jun. 2009, pp. 584-586.

Liu et al., "6.2 W/Mm and Record 33.8% PAE at 94 GHz From N-Polar GaN Deep Recess MIS-HEMTs With ALD Ru Gates", IEEE Microwave and Wireless Components Letters, vol. 31, No. 6, Jun. 2021, pp. 748-751.

* cited by examiner

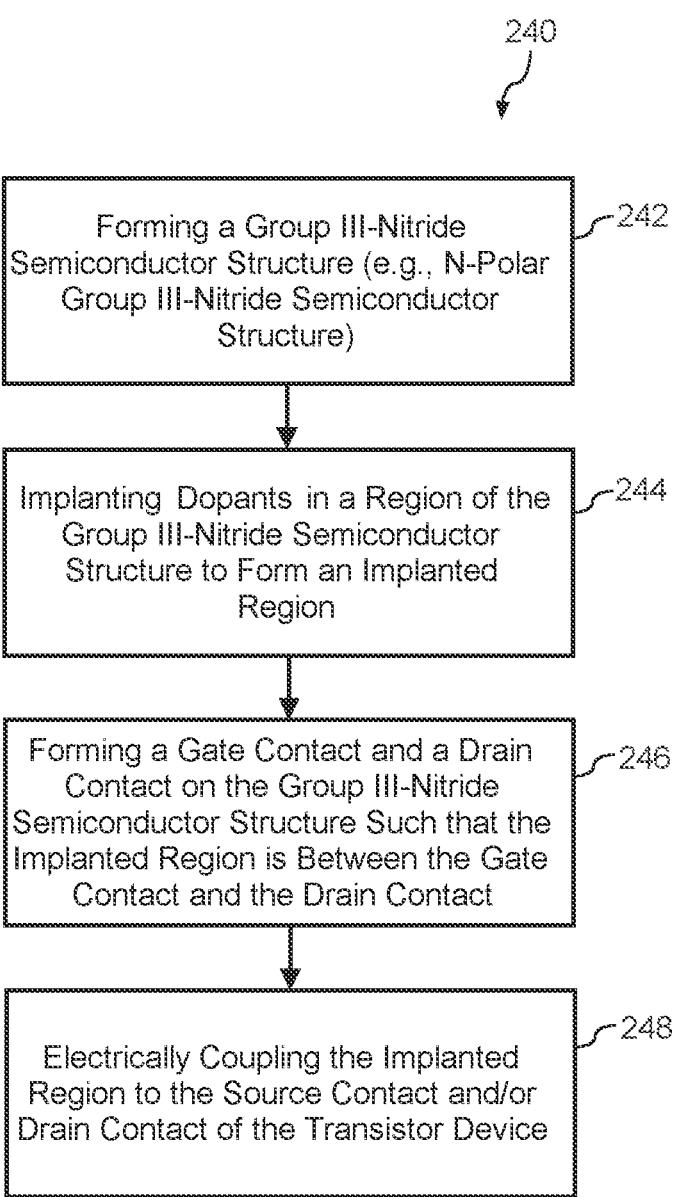

240

Forming a Group III-Nitride Semiconductor Structure (e.g., N-Polar Group III-Nitride Semiconductor Structure) 242

Implanting Dopants in a Region of the Group III-Nitride Semiconductor Structure to Form an Implanted Region 244

Forming a Gate Contact and a Drain Contact on the Group III-Nitride Semiconductor Structure Such that the Implanted Region is Between the Gate Contact and the Drain Contact 246

Electrically Coupling the Implanted Region to the Source Contact and/or Drain Contact of the Transistor Device 248

FIG. 19

FIELD REDUCING STRUCTURES FOR NITROGEN-POLAR GROUP III-NITRIDE SEMICONDUCTOR DEVICES

FIELD

The present disclosure relates generally to semiconductor devices.

BACKGROUND

Power semiconductor devices are widely used to carry large currents, support high voltages and/or operate at high frequencies such as radio frequencies. A wide variety of power semiconductor devices are available for different applications including, for example, power switching devices and power amplifiers. Many power semiconductor devices are implemented using various types of field effect transistors (FETs) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistors, etc.

Power semiconductor devices may be fabricated from wide band gap semiconductor materials (e.g., having a band-gap greater than 1.40 eV). For example, power HEMTs may be fabricated from gallium nitride (GaN) or other Group III nitride-based material systems that are formed, for instance, on a silicon carbide (SiC) substrate or other substrate. As used herein, the term "Group III nitride" refers to those semiconducting compounds formed between nitrogen and the elements in Group III of the periodic table, usually aluminum (Al), gallium (Ga), and/or indium (In). These compounds have empirical formulas in which one mole of nitrogen is combined with a total of one mole of the Group III elements. For high power, high temperature, and/or high frequency applications, devices formed in wide band gap semiconductor materials such as silicon carbide (e.g., 2.996 eV band gap for alpha silicon carbide at room temperature) and the Group III-nitrides (e.g., 3.36 eV band gap for gallium nitride at room temperature) may provide higher electric field breakdown strengths and higher electron saturation velocities as compared to gallium arsenide (GaAs) and silicon (Si) based devices.

SUMMARY

Aspects and advantages of embodiments of the present disclosure will be set forth in part in the following description, or may be learned from the description, or may be learned through practice of the embodiments.

One example aspect of the present disclosure is directed to a transistor device. The transistor device includes a nitrogen-polar (N-polar) Group III-nitride semiconductor structure. The transistor device includes a source contact, a drain contact, and a gate contact. The transistor device includes a field reducing structure operable to reduce an electric field in a region in the N-polar Group III-nitride semiconductor structure between the gate contact and the drain contact.

Another example aspect of the present disclosure is directed to a transistor device. The transistor device includes an N-polar Group III-nitride semiconductor structure. The transistor device includes a field plate overlapping the N-polar Group III-nitride semiconductor structure.

Yet another example aspect of the present disclosure is directed to a transistor device. The transistor device includes a nitrogen-polar (N-polar) Group III-nitride semiconductor structure. The transistor device includes a source contact, a drain contact, and a gate contact. The transistor device includes an implanted region in the Group III-nitride semiconductor structure in a region between the gate contact and the drain contact.

Yet another example aspect of the present disclosure is directed to a method of forming a transistor device. The method includes forming an N-polar Group III-nitride semiconductor structure. The method includes forming a field plate overlapping at least a portion of the N-polar Group III-nitride semiconductor structure.

Yet another example aspect of the present disclosure is directed to a method of forming a transistor device. The method includes forming a Group III-nitride semiconductor structure. The method includes implanting dopants in a region of the Group III-nitride semiconductor structure to form an implanted region. The method includes forming a gate contact and a drain contact on the Group III-nitride semiconductor structure such that the implanted region is between the gate contact and the drain contact.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which:

FIG. 19 depicts a flow chart of an example method according to example embodiments of the present disclosure.

DETAILED DESCRIPTION

Figure 1:
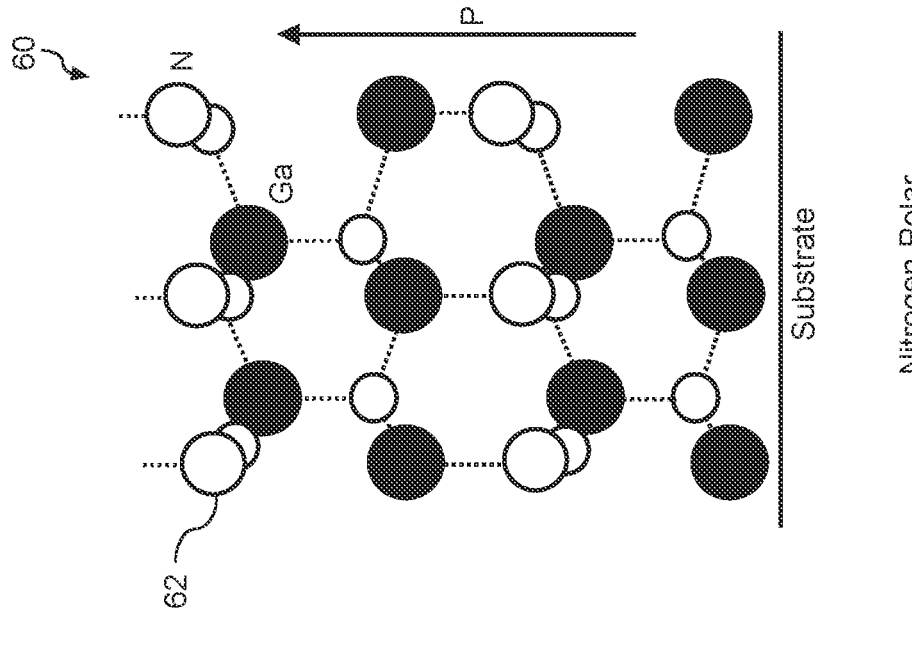
FIG. 1 depicts example metal-polar and nitrogen-polar (N-polar) Group-III nitride crystal structures.
Figure 1:
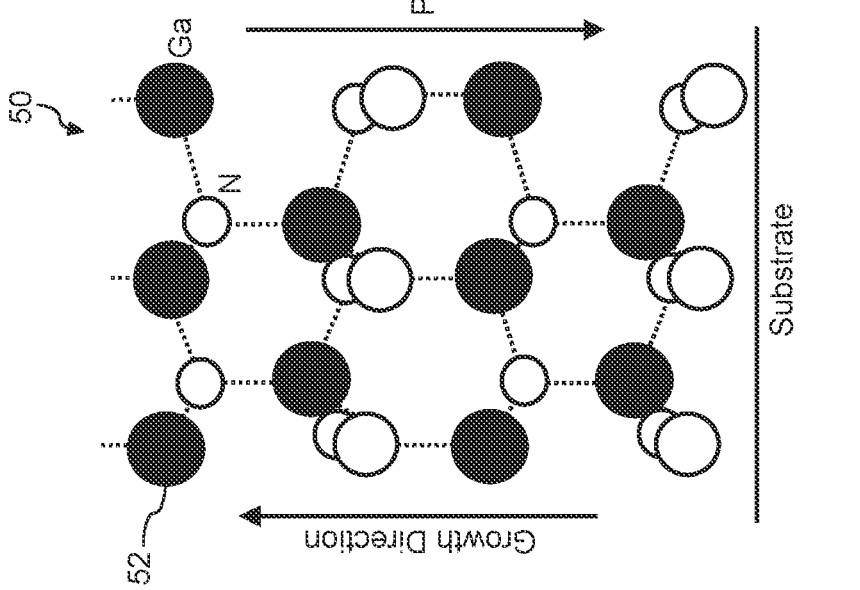

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations may be made to the embodiments without departing from the scope or spirit of the present disclosure. For instance, features illustrated or described as part of one embodiment may be used with another embodiment to yield a still further embodiment. Thus, it is intended that aspects of the present disclosure cover such modifications and variations.

Semiconductor devices may be used in power electronics applications. For instance, transistor devices, such as high electron mobility transistors (HEMTs), may be used in power electronics applications. HEMTs fabricated in Group III-nitride based material systems may have the potential to generate large amounts of radio frequency (RF) power because of the combination of material characteristics that includes high breakdown fields, wide band gaps, large conduction band offset, and/or high saturated electron drift velocity. As such, Group III-nitride based HEMTs may be promising candidates for high frequency and/or high-power RF applications (as well as for low frequency high power switching applications) as discrete transistors or as coupled with other circuit elements, such as in monolithic microwave integrated circuit (MMIC) devices.

Transistor devices such as HEMT devices may be classified into depletion mode and enhancement mode types, corresponding to whether the transistor is in an ON-state or an OFF-state at a gate-source voltage of zero. In enhancement mode devices, the devices are OFF at zero gate-source voltage, whereas in depletion mode devices, the device is ON at zero gate-source voltage. Often, high performance Group III nitride-based HEMT devices may be implemented as depletion mode (normally-on) devices, in that they are conductive at a gate-source bias of zero due to the polarization-induced charge at the interface of the barrier and channel layers of the device.

When an HEMT device is in an ON-state, a two-dimensional electron gas (2DEG) is formed at the heterojunction of two semiconductor materials with different band gap energies, where the smaller band gap material has a higher electron affinity. The 2DEG is an accumulation layer in the smaller band gap material and may include a very high sheet electron concentration. Additionally, electrons that originate in the wider-band gap semiconductor material transfer to the 2DEG layer, allowing high electron mobility due to reduced ionized impurity scattering. This combination of high carrier concentration and high carrier mobility may give the HEMT device a very large transconductance (which may refer to the relationship between output current and input voltage) and may provide a strong performance advantage over MOSFETs for high-frequency applications.

HEMT devices may include metal-polar (e.g., Ga-polar) or nitrogen-polar (e.g., N-polar) Group III-nitride semiconductor structures. More specifically, Group III-nitride semiconductor structures may have a hexagonal wurtzite crystal structure that lacks inversion symmetry along a c-plane of the crystal structure. The lack of inversion symmetry may result in polarization effects. The polarization effects may lead to, for instance, a spontaneous polarization dipole in the Group III-nitride semiconductor structure. A direction associated with the spontaneous polarization dipole may determine whether the Group III-nitride semiconductor structure is metal-polar or N-polar.

For instance, FIG. 1 depicts an example metal-polar Group III nitride semiconductor structure 50 (e.g., Ga-polar GaN) and an example N-polar Group III-nitride semiconductor structure 60 (e.g., N-polar GaN). As shown, the metal-polar Group III-nitride semiconductor structure 50 and the N-polar Group III-nitride semiconductor structure 60 each have a hexagonal wurtzite crystal structure. In a wurtzite crystal structure, the metal (e.g., gallium) and the nitrogen are arranged in separate distinct layers. The metal-polar (e.g., Ga-polar) Group III-nitride semiconductor structure 50 has a metal face 52 (e.g., gallium face) in the growth direction of the semiconductor structure 50 relative to a substrate. The direction of the spontaneous polarization dipole P may be opposite the growth direction in the metal-polar Group III-nitride semiconductor structure 50. The N-polar semiconductor structure 60 has a nitrogen face 62 in the growth direction of the semiconductor structure 60 relative to a substrate. The direction of the spontaneous polarization dipole P may be the same as the growth direction in the N-polar Group III-nitride semiconductor structure 60.

HEMT devices having N-polar Group III-nitride semiconductor structures may include a thick cap layer (e.g., 500 Angstroms to about 1000 Angstroms). The thick cap layer in HEMT devices including an N-polar Group III-nitride semiconductor structure may bury the channel layer and the 2DEG for the HEMT device deep below the surface of the semiconductor structure. By burying the channel layer and 2DEG deep below the surface of the semiconductor structure, trapping and other surface effects on the 2DEG may be mitigated by physically moving the 2DEG a larger distance away from the surface of the semiconductor structure. In addition, the increased thickness of the cap layer may provide for increased polarization of the semiconductor structure at the interface between the channel layer and a back barrier layer. The back barrier layer may be modified to control the channel layer charge density independent of the gate-to-channel layer distance. The thick cap layer for N-polar Group III-nitride semiconductor materials may provide for increased charge at the interface between the channel layer and a first cap layer acting as a confining layer for the channel layer, increasing carrier concentration and electron mobility of the 2DEG. This may lead to enhanced transconductance of the 2DEG and improved performance of the transistor device. For instance, the increased transconductance may provide for a lower on-resistance of the transistor device as well as suitability for use at higher frequencies, such as at frequencies of 40 GHz or greater. As a result, HEMT devices including N-polar Group III-nitride structures have recently been shown to deliver significant performance advantages, particularly at operating frequencies in the millimeter wave frequency ranges (e.g., 40 GHz or greater) relative to HEMT devices with traditional metal-polar Group-III nitride structures.

Field plates may be used in conjunction with HEMT devices with metal-polar Group-III nitride semiconductor structures. Field plates may increase breakdown voltage of the HEMT device as well as reduce electric field in the Group-III nitride semiconductor structure. Field plates may also reduce trapping effects. However, field plates may reduce radio frequency performance at higher frequencies.

HEMT devices having N-polar Group III-nitride semiconductor structures may have RF applications in frequency bands of less than 40 GHz. For instance, larger HEMT devices (e.g., gate length of 100 nm or greater, such as about 150 nm or greater) having N-polar Group III-nitride semiconductor structure may be used for applications in the Ka-band (e.g., frequencies in a range of about 26.5 GHz to about 40 GHZ) and/or the X-band (e.g., frequencies in a range of about 7 GHz to 12 GHz).

According to example aspects of the present disclosure, a transistor device, such as an HEMT device having a gate length of about 100 nm or greater, may include a field reducing structure operable to reduce an electric field in an N-polar Group III-nitride structure in a region between a gate contact and a drain contact for the semiconductor device. The field reducing structure may, for instance, reduce a gate drain capacitance (Cgd) for the transistor device and increase gain and power added efficiency (PAE) for the device at high power and at frequencies of less than about 40 GHZ, such as frequencies in the Ka-band or the X-band.

In some embodiments, the field reducing structure may be a field plate overlapping the N-polar Group III-nitride semiconductor structure. As used herein, a first structure "at least partially overlaps" or is "overlapping" a second structure if an axis that is perpendicular to a major surface of the first structure passes through both the first structure and the second structure. The field plate may be a metal structure (e.g., gold, nickel, platinum). The field plate may be electrically coupled, for instance, to a source contact for the transistor device, a gate contact for the transistor device, and/or another bias or supply through a separate contact. In some examples, the field plate may be floating.

In some examples, the field plate may include a portion that at least partially overlaps the gate contact for the transistor device. However, in some examples, the field plate may not overlap the gate contact. In some examples, a dielectric layer, such as silicon nitride, may be between the field plate and the N-polar Group III-nitride semiconductor structure. However, in some examples, the field plate may be directly on the N-polar Group III-nitride semiconductor structure such that the field plate forms a Schottky contact with the Group III-nitride semiconductor structure.

In some examples, the field plate may be at least partially recessed into the N-polar Group III-nitride semiconductor structure. For instance, the field plate may be at least partially recessed into one or more cap layers of the N-polar Group III-nitride semiconductor structure. This may, in some examples, bring the field plate closer to an interface between a channel layer and a barrier layer (e.g., closer to the 2DEG) in transistor devices having a thick cap layer that buries the channel layer deep below a surface of the N-polar Group III-nitride semiconductor structure.

In some examples, the field reducing structure includes an implanted region in the Group III-nitride semiconductor structure. The implanted region may be in a region in the Group III-nitride semiconductor structure between the gate contact and the drain contact (e.g., a drain access region). The implanted region may be in, for instance, a cap layer of an N-polar Group III-nitride semiconductor structure. The implanted region may include implanted dopants, such as silicon (Si), magnesium (Mg), fluorine (F), iron (Fc), carbon (C), tin (Sn), oxygen (O), or other dopants. The implanted region may be electrically connected to the source contact and/or to the drain contact. The implanted region may be used to reduce an electric field in the Group III-nitride semiconductor structure.

Aspects of the present disclosure provide a number of technical effects and benefits. For instance, the field reducing structure may affect a gate drain capacitance (Cgd) of the transistor device, leading to increased performance in RF applications at frequencies below about 40 GHz, such as frequencies in the Ka-band and/or in the X-band. The field reducing structure may increase breakdown voltage and reduce electron trapping due to the presence of electric fields in the Group III-nitride semiconductor structure. The use of the field reducing structure may increase gain of the transistor device and power added efficiency (PAE) of the transistor device in RF applications at operating frequencies below about 40 GHz.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Aspects of the present disclosure are discussed with reference to an HEMT transistor device for purposes of illustration and discussion. Those of ordinary skill in the art, using the disclosures provided herein, will appreciate that certain aspects of the present disclosure may be applicable to other semiconductor devices without deviating from the scope of the present disclosure, such as Schottky diodes.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

Figures 2, 3:
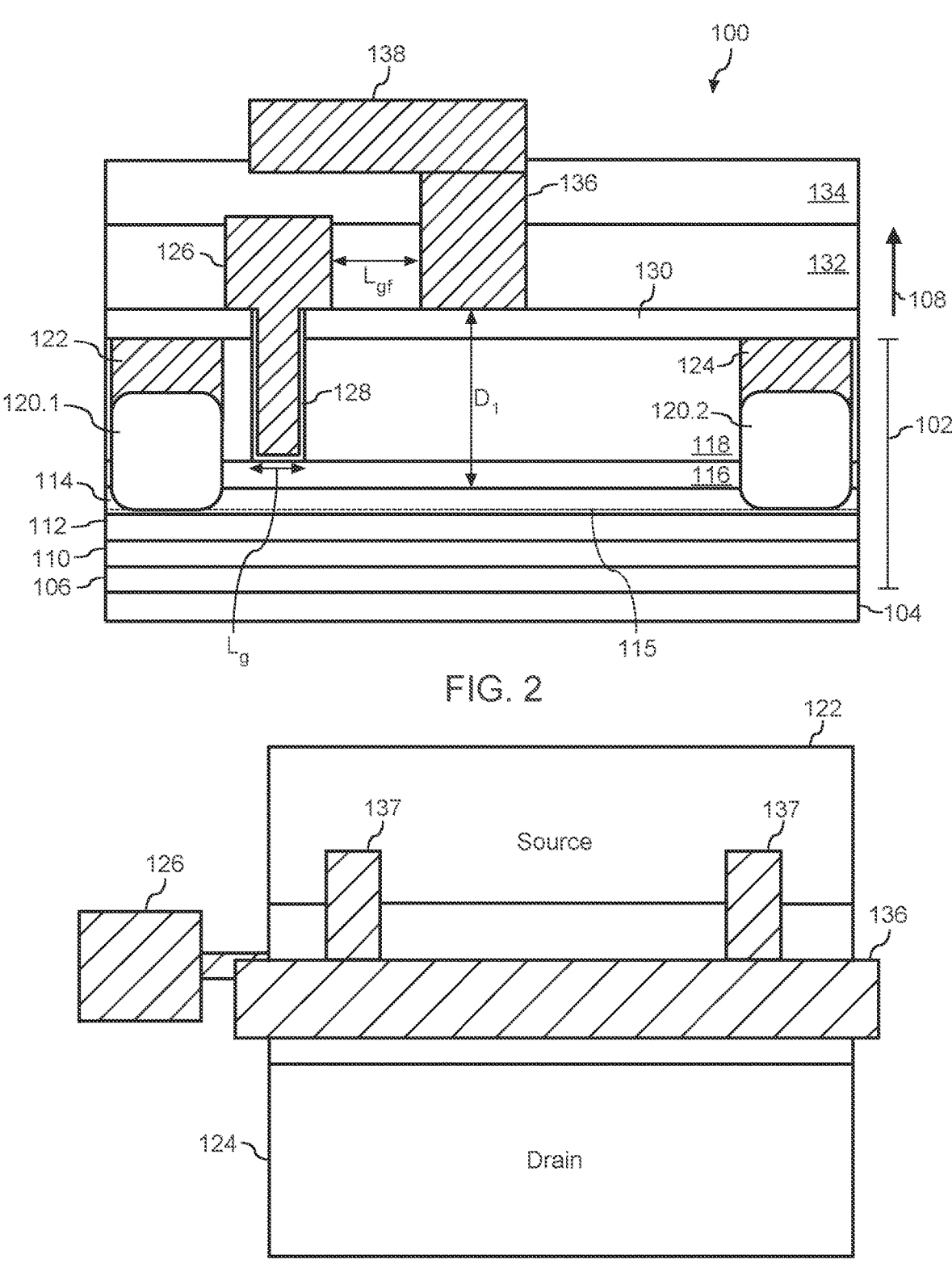
FIG. 2 depicts an example semiconductor device according to example embodiments of the present disclosure.
FIG. 3 depicts example conductive path between a field plate and a source contact according to example embodiments of the present disclosure.

FIG. 2 depicts a cross-sectional view of an example HEMT device 100 according to example embodiments of the present disclosure. FIG. 2 is intended to represent structures for identification and description and is not intended to represent the structures to physical scale. The HEMT device 100 may include a semiconductor structure 102. The semiconductor structure 102 may be a Group III-nitride semiconductor structure, such as an N-polar Group III-nitride semiconductor structure.

As used herein, the term "Group III nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN, ScAlN and AlInGaN. As is well understood by those in this art, the Group III elements may combine with nitrogen to form binary (e.g., GaN), ternary (e.g., AlGaN, AlInN, ScAlN), and quaternary (e.g., AlInGaN) compounds. These compounds all have empirical formulas in which one mole of nitrogen is combined with a total of one mole of the Group III elements.

The semiconductor structure 102 may be on a substrate 104. The substrate 104 may be a semiconductor material. For instance, the substrate 104 may be a silicon substrate, a silicon carbide (SiC) substrate, a sapphire substrate, or other suitable substrate. In some embodiments, the substrate 104 may be a semi-insulating SiC substrate that may be, for example, the 4H polytype of silicon carbide. Other SiC candidate polytypes may include the 3C, 6H, and 15R polytypes. The substrate may be a High Purity Semi-Insulating (HPSI) substrate, available from Wolfspeed, Inc. The term "semi-insulating" is used descriptively herein, rather than in an absolute sense.

In some embodiments, the SiC bulk crystal of the substrate 104 may have a resistivity equal to or higher than about $1 \times 10^5$ ohm-cm at room temperature. Example SiC substrates that may be used in some embodiments are manufactured by, for example, Wolfspeed, Inc., and methods for producing such substrates are described, for example, in U.S. Pat. No. Re. 34,861, U.S. Pat. Nos. 4,946,547, 5,200,022, and 6,218,680, the disclosures of which are incorporated by reference herein. Although SiC may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 104 may be a SiC wafer, and the HEMT device 100 may be formed, at least in part, via wafer-level processing, and the wafer may then be diced to provide a plurality of individual HEMT devices 100. In some embodiments, the substrate 104 of the HEMT device 100 may be a thinned substrate 104. In some embodiments, the thickness of the substrate 104 may be about 100 μm or less, such as about 75 μm or less, such as about 50 μm or less.

The semiconductor structure 102 may include an optional nucleation layer 106 on the substrate 104. The nucleation layer 106 may be, for instance, a GaN layer and/or an AlN layer on the substrate 104 to provide a crystal structure transition between, for instance, a SiC substrate 104 and the Group III-nitride semiconductor structure 102. The nucleation layer 106 may be deposited on the substrate 104 using, for instance, metal-organic chemical vapor deposition (MOCVD), molecular beam epitaxy (MBE), or hydride vapor phase epitaxy (HVPE).

The semiconductor structure 102 may be an N-polar Group III-nitride semiconductor structure with an outward N-face in the growth direction 108 of the semiconductor structure 102. The semiconductor structure 102 may include several layers. In the example HEMT device 100 of FIG. 2, the semiconductor structure includes a buffer layer 110, a back barrier layer 112, a channel layer 114, a first cap layer 116, and a second cap layer 118. However, those of ordinary skill in the art, using the disclosures provided herein, will understand that aspects of the present disclosure are applicable to devices having semiconductor structures with different layer arrangements. The semiconductor structure 102 may be formed by epitaxial growth on the substrate 104. Techniques for epitaxial growth of Group III-nitrides have been described in, for example, U.S. Pat. Nos. 5,210,051, 5,393,993, and 5,523,589, the disclosures of which are incorporated by reference herein.

The buffer layer 110 may be an N-polar Group III nitride, such as $Al_vGa_{1-v}N$, where $0 \leq v < 0.1$. In some embodiments, the aluminum mole fraction v is approximately 0 (e.g., 0.05 or less), indicating that the buffer layer 110 is GaN. The buffer layer 110 may or may not include other Group III-nitrides such as InGaN, AlInGaN or the like. The buffer layer 110 may be undoped or only unintentionally doped. In some examples, the buffer layer 110 may be iron doped to make the buffer layer semi-insulating. The buffer layer 110 may be grown to a thickness in the range of about 0.5 μm to about 5 μm, such as about 2 μm. The buffer layer 110 may be a multi-layer structure, such as a superlattice or combinations of GaN, AlGaN or the like. The buffer layer 110 may be under compressive strain in some embodiments.

The semiconductor structure 102 may include the back barrier layer 112 on the buffer layer 110. The back barrier layer 112 may be an N-polar Group III nitride, such as $Al_wGa_{1-w}N$ where $0.1 \leq w < 0.4$, indicating that the back barrier layer 112 is an AlGaN layer. In some embodiments, the back barrier layer 112 may be a ScAlN layer or a ScAlGaN layer. The back barrier layer 112 may or may not include other Group III-nitrides such as InGaN, AlInGaN or the like. The back barrier layer 112 may have a different band gap relative to the channel layer 114. The back barrier layer 112 may have a thickness in a range of about 250 Angstroms to about 350 Angstroms, such as about 300 Angstroms.

In some embodiments, the back barrier layer 112 may be a multilayer structure. For instance, in one example, the back barrier layer 112 may include a first layer of n+ doped GaN with a thickness of about 100 Angstroms. The back barrier layer 112 may include a second layer of graded $Al_{w.1}Ga_{1-w.1}N$ on the first layer, where w.1 varies from about 0.05 to about 0.4. The second layer of graded $Al_wGa_{1-w}N$ may have a thickness of about 100 Angstroms. The back barrier layer 112 may include a third layer of $Al_{w.2}Ga_{1-w.2}N$ on the second layer, where w.2 is in a range of 0.3 to 0.4. The thickness of the third layer may be about 100 Angstroms. The back barrier layer 112 may include a fourth layer of AlN on the third layer. The thickness of the fourth layer may be in a range of about 5 Angstroms to about 15 Angstroms, such as about 7 Angstroms.

The semiconductor structure 102 may include the channel layer 114 on the back barrier layer 112. The channel layer 114 may be an N-polar Group III-nitride, such as $Al_xGa_{1-x}N$, where $0 \leq x < 0.1$, provided that the energy of the conduction band edge of the channel layer 114 is less than the energy of the conduction band edge of the back barrier layer 112 at the interface between the channel layer 114 and the back barrier layer 112. The channel layer 114 may have a band gap that is different from the band gap of the back barrier layer 112. In some embodiments, the aluminum mole fraction x is approximately 0 (e.g., 0.05 or less), indicating that the channel layer 114 is GaN. The channel layer 114 may or may not include other Group III-nitrides such as InGaN, AlInGaN or the like. The channel layer 114 may have a thickness in a range of about 75 Angstroms to about 125 Angstroms, such as about 100 Angstroms.

A 2DEG 115 may be induced in the channel layer 114 at the interface between the channel layer 114 and the back barrier layer 112. The 2DEG 115 is highly conductive and allows conduction between the source and drain regions of the HEMT device 100. The 2DEG 115 may be controlled under operation of a gate, such that the HEMT device 100 acts as a controllable transistor device.

The semiconductor structure 102 includes a first cap layer 116 (e.g., an AlGaN cap layer) on the channel layer 114. The first cap layer 116 may be an N-polar Group III-nitride, such as $Al_yGa_{1-y}N$ where $0.1 \leq y < 0.4$, indicating that the first cap layer 116 is an AlGaN layer. In some embodiments, the aluminum mole fraction y is in a range of about 0.2 to about 0.3. In some embodiments, the first cap layer 116 may be a ScAlN layer or a ScAlGaN layer. The first cap layer 116 may or may not include other Group III-nitrides such as InGaN, AlInGaN or the like. The first cap layer may have a band gap that is different from the band gap of the channel layer 114. The first cap layer 116 may have a thickness in a range of about 15 Angstroms to about 50 Angstroms, such as about 26 Angstroms.

The semiconductor structure 102 includes a second cap layer 118 on the first cap layer 116. The second cap layer 118 may be an N-polar Group III-nitride, such as $Al_zGa_{1-z}N$, where $0 \leq z < 0.1$. In some embodiments, the aluminum mole fraction z is approximately 0 (e.g., 0.05 or less), indicating that the second cap layer 118 is a GaN layer. The second cap layer 118 may or may not include other Group III-nitrides such as InGaN, AlInGaN or the like. The second cap layer 118 buries the channel layer 114 deep below the surface of semiconductor structure 102 such that the channel layer 114 is a buried layer at a depth of about 275 Angstroms or greater from the surface of the semiconductor structure 102, such as about 500 Angstroms or greater from the surface of the semiconductor structure 102, such as in a range of about 275 Angstroms to about 1000 Angstroms from the surface of the semiconductor structure 102. The second cap layer 118 may have a thickness in a range of about 250 Angstroms to about 1000 Angstroms, such as about 500 Angstroms.

The semiconductor structure 102 includes implanted regions 120.1 and 120.2. The implanted regions 120.1 and 120.2 include a distribution of implanted dopants (e.g., ions) of a first conductivity type such that the implanted regions 120.1 and 120.2 are n-type regions. The implanted regions 120.1 and 120.2 extend through the semiconductor structure 102 and into the channel layer 114.

The HEMT device 100 includes electrodes on the implanted regions 120.1 and 120.2. More particularly, the HEMT device 100 may include a source contact 122 on the implanted region 120.1. The HEMT device 100 may include a drain contact 124 on the implanted region 120.2. The source contact 122 and the drain contact 124 may be laterally spaced apart from each other. In some embodiments, the source contact 122 and the drain contact 124 may include a metal that may form an ohmic contact to a Group III-nitride based semiconductor material. Suitable metals may include refractory metals, such as titanium (Ti), tungsten (W), titanium tungsten (TiW), silicon (Si), titanium tungsten nitride (TiWN), tungsten silicide (WSi), rhenium (Re), niobium (Nb), Ni, gold (Au), aluminum (Al), tantalum (Ta), molybdenum (Mo), $NiSi_x$, titanium silicide (TiSi), titanium nitride (TiN), tungsten silicon nitride (WSiN), platinum (Pt) and the like. In some embodiments, the source contact 122 may be an ohmic contact. The drain contact 124 may be an ohmic contact. In some embodiments, the source contact 122 and/or the drain contact 124 may include a plurality of layers to form an ohmic contact that may be provided as described, for example, in U.S. Pat. Nos.

8,563,372 and 9,214,352, the disclosures of which are incorporated by reference herein.

The HEMT device 100 may include a gate contact 126. The gate contact 126 may extend at least partially through a recess (e.g., an ALE defined recess) in the cap layer 118 so that the gate contact 126 is proximate to the first cap layer 116. In some examples, the gate contact 126 may have a gate length $L_G$ in a range of about 100 nm or greater, such as about 150 nm or greater. The gate length is the length of the gate contact 126 proximate to the first cap layer 116.

A passivation layer 128 may be located between the gate contact 126 and the first cap layer 116. The passivation layer 128 may be SiN. Other suitable dielectric layers may be used as the passivation layer 128, such as $SiO_2$, MgOx, MgNx, ZnO, SiNx, SiOx, SiON, or other dielectric layers. The passivation layer 128 may be formed, for instance, using MOCVD process(es), atomic layer deposition (ALD) process(es), and/or sputter deposition processes. The passivation layer 128 may serve as a gate dielectric. In some examples, the passivation layer 128 may have a thickness, for instance, of about 5 Angstroms to about 100 Angstroms, such as about 10 Angstroms to about 50 Angstroms.

The gate contact 126 may be a T-shaped gate or a gamma gate, the formation of which is discussed by way of example in U.S. Pat. Nos. 8,049,252, 7,045,404, and 8,120,064, the disclosures of which are incorporated by reference herein. Materials capable of making a contact (e.g., a Schottky contact) to a Group III-nitride based semiconductor material may be used, such as, for example, nickel (Ni), platinum (Pt), nickel silicide ($NiSi_x$), copper (Cu), palladium (Pd), chromium (Cr), tungsten (W) and/or tungsten silicon nitride (WSiN).

The HEMT device 100 may include a dielectric layer 130 on the semiconductor structure 102. The dielectric layer 130 may be, for instance, dielectric materials, such as $SiO_2$, MgOx, MgNx, ZnO, SiNx, SiOx, SiON, alloys or layer sequences thereof. In particular examples, the dielectric layer 130 may be silicon nitride. The dielectric layer 130 may be formed using MOCVD process(es), ALD process(es), sputter deposition process(es), or other suitable process(es). The dielectric layer 130 may have a thickness in a range of about 0.05 μm to about 2 μm.

One or more insulating layers (e.g., insulating layers 132 and 134) may be on the HEMT device 100. For instance, the HEMT device 100 may be encapsulated in an insulating material without deviating from the scope of the present disclosure. The insulating layers 132 and 134 may be, for instance, dielectric materials, such as $SiO_2$, SiON, MgOx, MgNx, ZnO, SiNx, SiOx, alloys or layer sequences thereof. The dielectric layer 130 may be formed using MOCVD process(es), ALD process(es), sputter deposition process(es), or other suitable process(es).

In some examples, the HEMT device 100 may be operable at frequencies of less than about 40 GHz. For instance, the HEMT device 100 may be operable in frequencies in the Ka-band (e.g., frequencies in a range of about 26.5 GHZ to about 40 GHZ) and/or the X-band (e.g., frequencies in a range of about 7 GHZ to 12 GHZ). In some examples, the HEMT device 100 may have a power density of up to 10 W/mm or greater in these frequency ranges, such as a power density in a range of 2.5 W/mm to about 12 W/mm.

A transistor device cell may be formed by the active region between the source contact 122 and the drain contact 124 under the control of a gate contact 126 between the source contact 122 and the drain contact 124. FIG. 2 depicts a cross-sectional view of one device cell of an HEMT device 100 for purposes of illustration.

According to example embodiments of the present disclosure, the HEMT device 100 includes a field plate 136. The field plate 136 may be located laterally between the gate contact 126 and the drain contact 124. The field plate 136 may overlap the N-polar Group III-nitride semiconductor structure 102. In the example of FIG. 2, the dielectric layer 130 may be between the field plate 136 and the N-polar polar Group III-nitride semiconductor structure 102. The field plate 136 may be electrically isolated from the channel layer 114 and from the gate contact 126.

The field plate 136 may include conductive materials. In some examples, the field plate 136 may be a metal, or a combination of metals, deposited using metallization methods. In some examples, the field plate 136 may include titanium, gold, nickel, a combination of gold/titanium, a combination of gold/nickel, or other suitable metal(s).

In some examples, there can be a space Lgf between the field plate 136 and the gate contact 126. The space Lgf may be wide enough to isolate the field plate 136 from the gate contact 126, but small enough to increase the field effect provided by the field plate 136. In some examples, the space Lgf may be in a range of about 1.0 μm or less, such as in a range of 0.1 μm to about 1.0 μm.

Figures 4, 5:
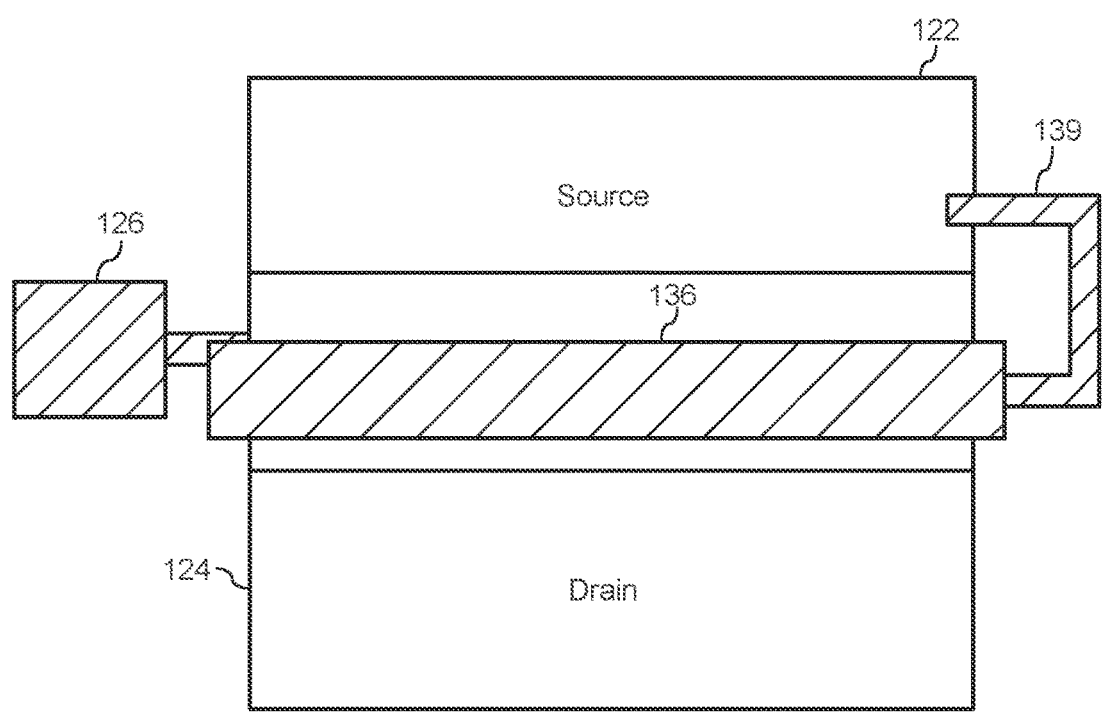
FIG. 4 depicts example conductive path between a field plate and a source contact according to example embodiments of the present disclosure.
FIG. 5 depicts an example semiconductor device according to example embodiments of the present disclosure.

The field plate 136 may be connected to the source contact 122 through an electrically conductive path. For instance, FIG. 3 depicts example electrically conductive paths that may be used to couple the field plate 136 to the source contact 122. In the example of FIG. 3, conductive buses 137 extend from the field plate 136 over the active areas of the HEMT device 100 to connect to the source contact 122. FIG. 4 depicts an example electrically conductive path that may be used to couple the field plate 136 to the source contact 122. In the example of FIG. 4, the field plate 136 is connected to source contact 122 using a conductive path 139 that runs outside the active area of the HEMT device 100. In some examples, the field plate 136 may be connected to the gate contact or other bias or supply contact. In some examples, the field plate 136 may be floating.

In the example of FIG. 2, the field plate 136 is not recessed into the N-polar Group III-nitride semiconductor structure 102. The field plate 136 has a laterally extending portion 138 that overlaps at least a portion of the gate contact 126. The insulating layer 134 can separate the laterally extending portion 138 of the field plate 136 from the gate contact 126 such that the field plate 136 is electrically isolated from the gate contact 126. The field plate 136 may be separated a distance $D_1$ from the channel layer 114. In some examples, the distance $D_1$ may be in a range of about 0.06 μm to about 0.6 μm.

FIG. 5 depicts a cross-sectional view of an example HEMT device 140 according to example embodiments of the present disclosure. FIG. 5 is intended to represent structures for identification and description and is not intended to represent the structures to physical scale. The HEMT device 140 of FIG. 5 is similar to the HEMT device 100 of FIG. 2, except that the field plate 136 does not include a laterally extending portion 138 that overlaps at least a portion of the gate contact 126. The field plate 136 is not recessed into the N-polar Group III-nitride semiconductor structure 102. The field plate 136 may be separated from the N-polar Group III-nitride semiconductor structure 102 by the dielectric layer 130. The field plate 136 may be separated a distance $D_1$ from the channel layer 114. In some examples, the distance $D_1$ may be in a range of about 0.06 μm to about 0.6 μm. The field plate 136 of FIG. 5 may be connected to the source contact 122 using one or more of the conductive paths described in FIGS. 3 and 4. In some examples, the field plate 136 may be connected to the gate contact or other bias or supply contact. In some examples, the field plate 136 may be floating.

Figures 6, 7:
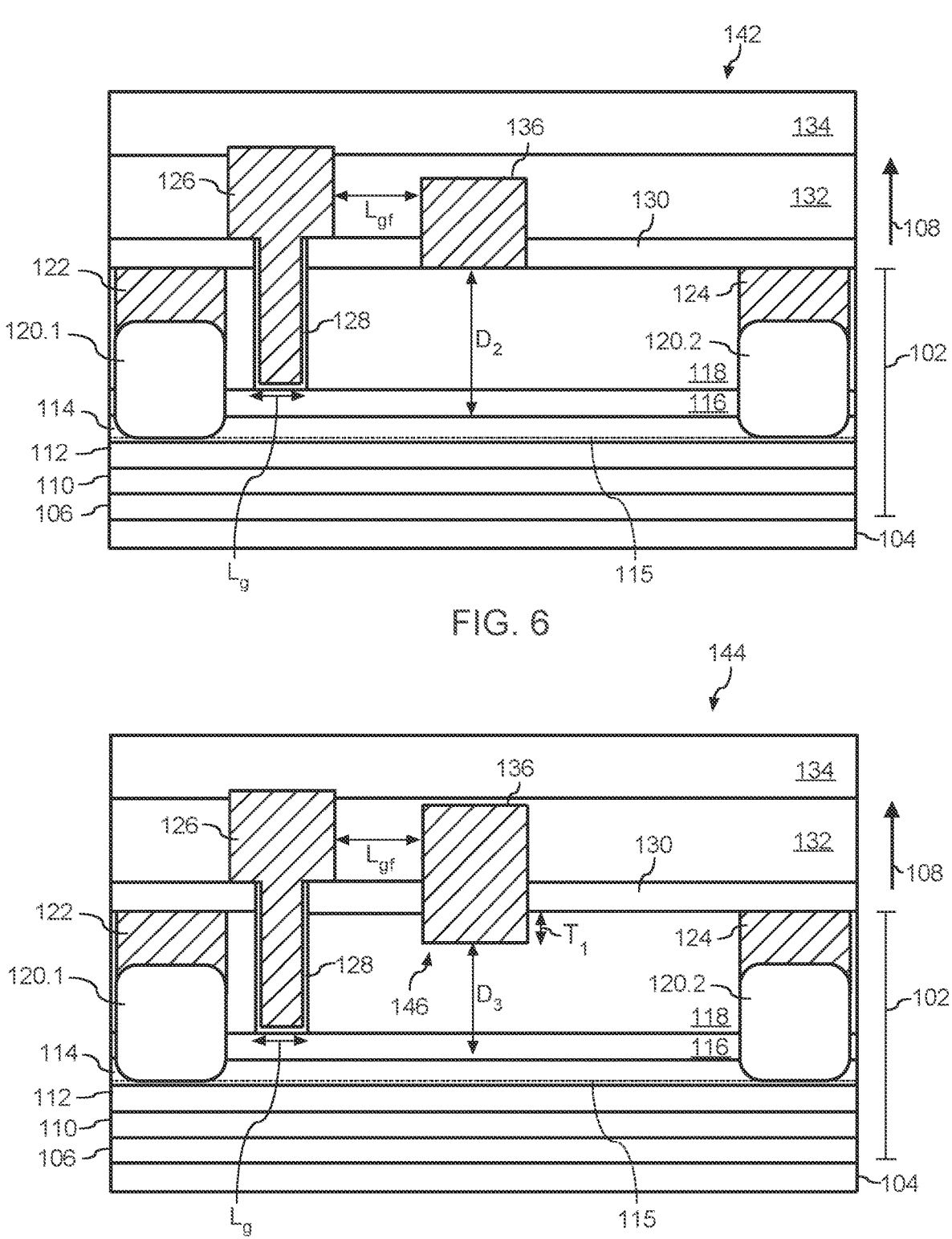
FIG. 6 depicts an example semiconductor device according to example embodiments of the present disclosure.
FIG. 7 depicts an example semiconductor device according to example embodiments of the present disclosure.

FIG. 6 depicts a cross-sectional view of an example HEMT device 142 according to example embodiments of the present disclosure. FIG. 6 is intended to represent structures for identification and description and is not intended to represent the structures to physical scale. The HEMT device 142 of FIG. 6 is similar to the HEMT device 140 of FIG. 5. However, the field plate 136 of the HEMT device 142 of FIG. 6 is directly on the N-polar Group III-nitride semiconductor structure 102. For instance, the field plate 136 is not separated from the N-polar Group III-nitride semiconductor structure 102 by the dielectric layer 130. Rather, the field plate 136 forms a Schottky contact with the N-polar Group III-nitride semiconductor structure 102. The material of the field plate 136 of FIG. 6 may be a material suitable for making a Schottky contact with the N-polar Group III-nitride semiconductor structure 102, such as nickel (Ni), platinum (Pt), nickel silicide (NiSi$_x$), copper (Cu), palladium (Pd), chromium (Cr), tungsten (W) and/or tungsten silicon nitride (WSiN). The field plate 136 may be separated a distance D$_2$ from the channel layer 114. In some examples, the distance D$_2$ may be in a range of about 500 Angstroms to about 1250 Angstroms. The field plate 136 of FIG. 6 may be connected to the source contact 122 using one or more of the conductive paths described in FIGS. 3 and 4.

FIG. 7 depicts a cross-sectional view of an example HEMT device 144 according to example embodiments of the present disclosure. FIG. 7 is intended to represent structures for identification and description and is not intended to represent the structures to physical scale. The HEMT device 144 of FIG. 7 is similar to the HEMT device 142 of FIG. 6. However, the field plate 136 is recessed in a recess 146 defined in the N-polar Group III-nitride semiconductor structure 102. In the example of FIG. 7, the recess 146 may extend at least partially into the second cap layer 118. The recess 146 may have a depth T$_1$ of about 100 Angstroms to about 750 Angstroms. The recess 146 may allow for the field plate 136 to be located closer to the channel layer 114. For instance, the field plate 136 may be separated a distance D$_3$ from the channel layer 114. In some examples, the distance D$_3$ may be in a range of about 250 Angstroms to about 900 Angstroms. The field plate 136 of FIG. 7 may be connected to the source contact 122 using one or more of the conductive paths described in FIGS. 3 and 4. In some examples, the field plate 136 may be connected to the gate contact or other bias or supply contact. In some examples, the field plate 136 may be floating.

Figures 8, 9:
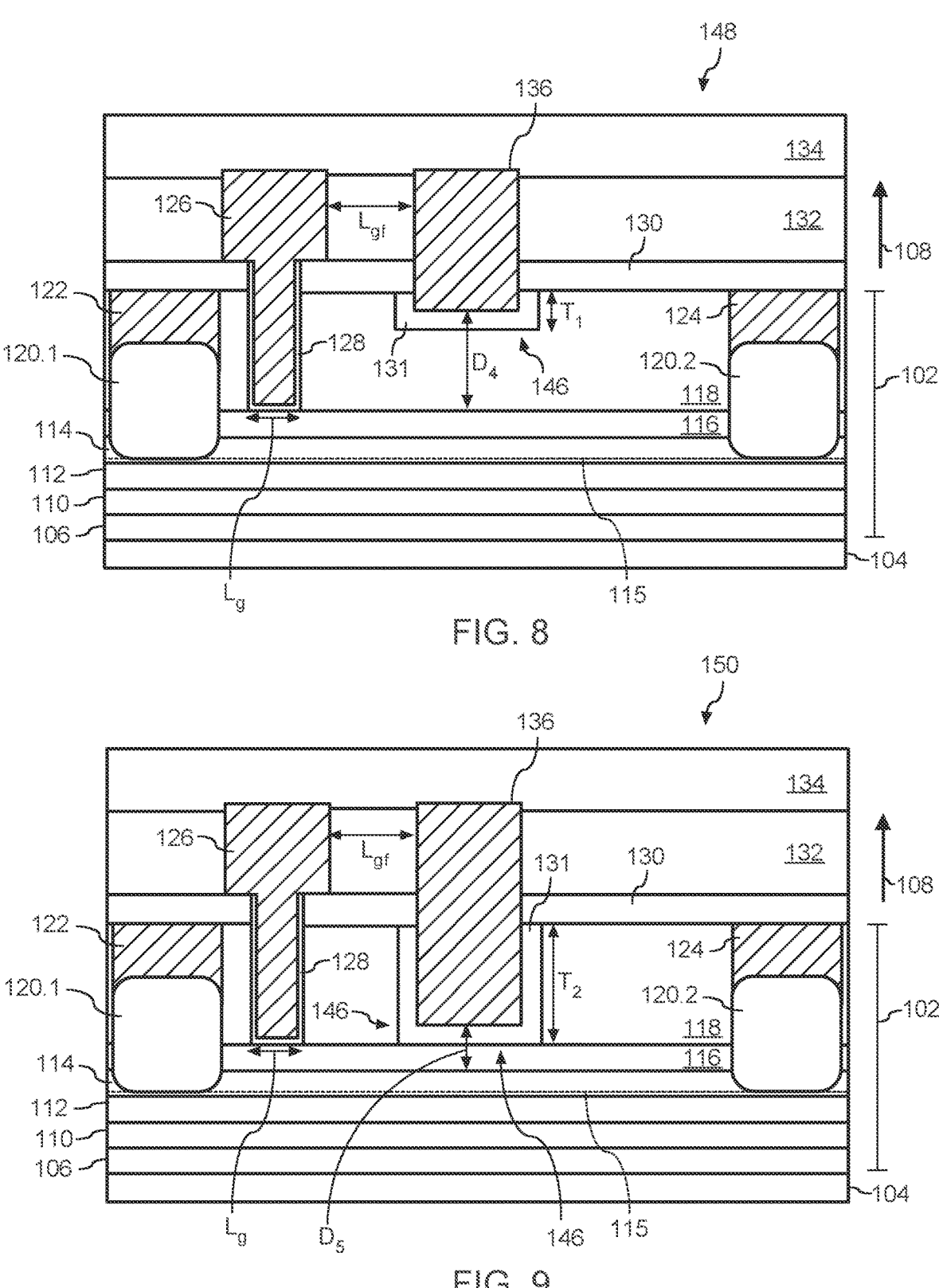
FIG. 8 depicts an example semiconductor device according to example embodiments of the present disclosure.
FIG. 9 depicts an example semiconductor device according to example embodiments of the present disclosure.

FIG. 8 depicts a cross-sectional view of an example HEMT device 148 according to example embodiments of the present disclosure. FIG. 8 is intended to represent structures for identification and description and is not intended to represent the structures to physical scale. The HEMT device 148 of FIG. 8 is similar to the HEMT device 144 of FIG. 7. The field plate 136 is recessed in a recess 146 defined in the N-polar Group III-nitride semiconductor structure 102. The field plate 136 may be separated from the N-polar Group III-nitride semiconductor structure 102 in the recess 146 by a dielectric layer 131. The dielectric layer 131 may be the same as or different from the dielectric layer 130. The dielectric layer 131 may have a thickness of, for instance, about 5 Angstroms to about 100 Angstroms, such as about 10 Angstroms to about 50 Angstroms. The dielectric layer 131 may be, for instance, dielectric materials, such as SiO$_2$, MgOx, MgNx, ZnO, SiNx, SiOx, SiON, alloys or layer sequences thereof. In particular examples, the dielectric layer 130 may be silicon nitride. The dielectric layer 131 may be formed using MOCVD process(s), ALD process(s), sputter deposition process(s), or other suitable process(s).

In the example of FIG. 8, the recess 146 may extend at least partially into the second cap layer 118. The recess 146 may have a depth T$_1$ of about 100 Angstroms to about 750 Angstroms. The recess 146 may allow for the field plate 136 to be located closer to the channel layer 114. For instance, the field plate 136 may be separated a distance D$_4$ from the channel layer 114. In some examples, the distance D$_4$ may be in a range of about 260 Angstroms to about 1000 Angstroms. The field plate 136 of FIG. 8 may be connected to the source contact 122 using one or more of the conductive paths described in FIGS. 3 and 4. In some examples, the field plate 136 may be connected to the gate contact or other bias or supply contact. In some examples, the field plate 136 may be floating.

FIG. 9 depicts a cross-sectional view of an example HEMT device 150 according to example embodiments of the present disclosure. FIG. 9 is intended to represent structures for identification and description and is not intended to represent the structures to physical scale. The HEMT device 150 of FIG. 9 is similar to the HEMT device 148 of FIG. 8. The field plate 136 is recessed in a recess 146 defined in the N-polar Group III-nitride semiconductor structure 102. The field plate 136 may be separated from the N-polar Group III-nitride semiconductor structure 102 in the recess 146 by a dielectric layer 131. The dielectric layer 131 may be the same as or different from the dielectric layer 130. The dielectric layer 131 may have a thickness, for instance, of about 5 Angstroms to about 100 Angstroms, such as about 10 Angstroms to about 50 Angstroms. The dielectric layer 131 may be, for instance, dielectric materials, such as SiO$_2$, MgOx, MgNx, ZnO, SiNx, SiOx, SiON, alloys or layer sequences thereof. In particular examples, the dielectric layer 130 may be silicon nitride. The dielectric layer 131 may be formed using MOCVD process(s), ALD process(s), sputter deposition process(s), or other suitable process(s).

In the example of FIG. 9, the recess 146 may extend all the way through the second cap layer 118. The recess 146 may have a depth T$_2$ of about 500 Angstroms to about 1000 Angstroms. The recess 146 may allow for the field plate 136 to be located closer to the channel layer 114. For instance, the field plate 136 may be separated a distance D$_5$ from the channel layer 114. In some examples, the distance D$_5$ may be in a range of about 20 Angstroms to about 150 Angstroms. The field plate 136 of FIG. 9 may be connected to the source contact 122 using one or more of the conductive paths described in FIGS. 3 and 4. In some examples, the field plate 136 may be connected to the gate contact or other bias or supply contact. In some examples, the field plate 136 may be floating.

Figures 10, 11:
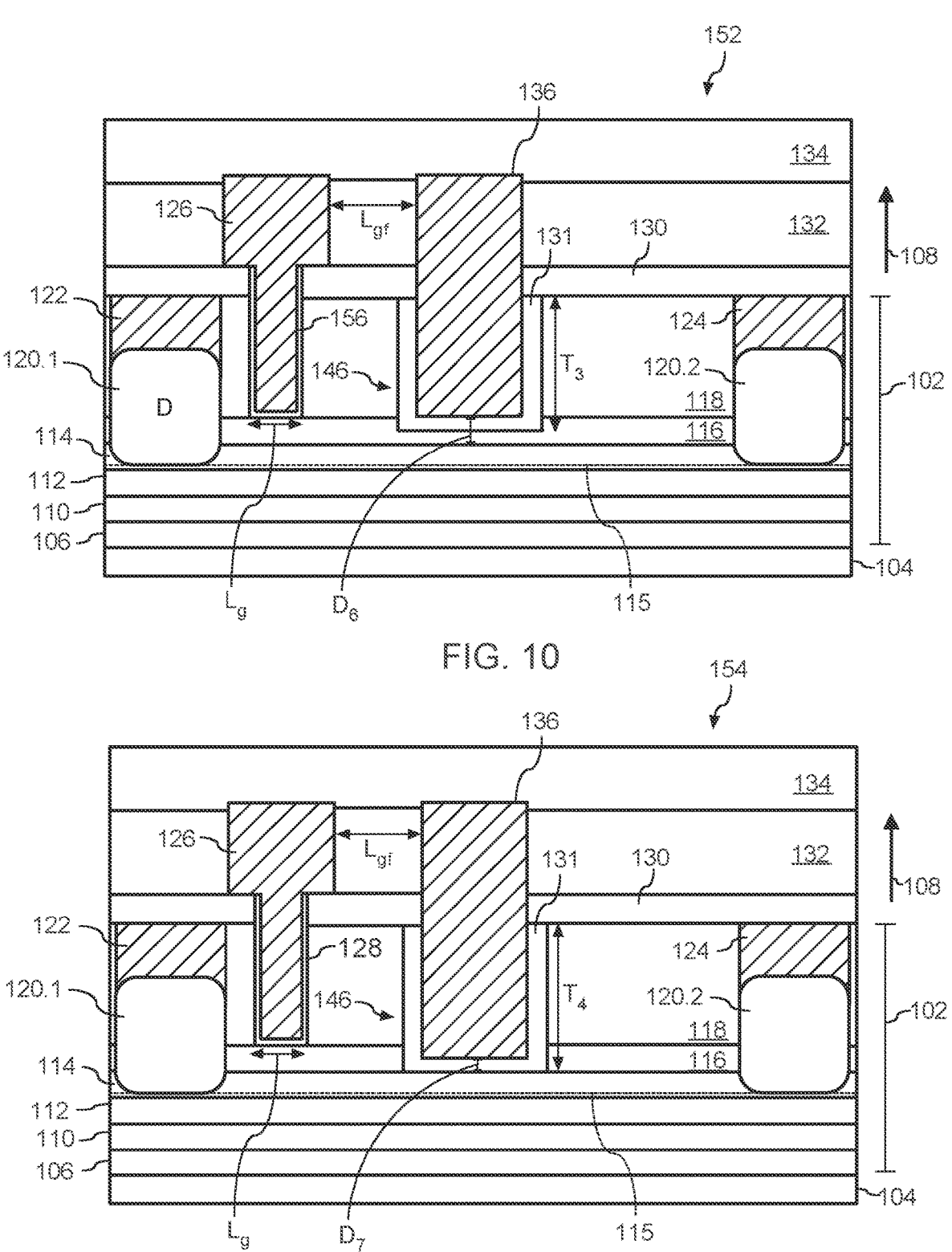
FIG. 10 depicts an example semiconductor device according to example embodiments of the present disclosure.
FIG. 11 depicts an example semiconductor device according to example embodiments of the present disclosure.

FIG. 10 depicts a cross-sectional view of an example HEMT device 152 according to example embodiments of the present disclosure. FIG. 10 is intended to represent structures for identification and description and is not intended to represent the structures to physical scale. The HEMT device 150 of FIG. 10 is similar to the HEMT device 150 of FIG. 9. The field plate 136 is recessed in a recess 146 defined in the N-polar Group III-nitride semiconductor structure 102. The field plate 136 may be separated from the N-polar Group III-nitride semiconductor structure 102 in the recess 146 by a dielectric layer 131. The dielectric layer 131 may be the same as or different from the dielectric layer 130. The dielectric layer 131 may have a thickness, for instance, of about 5 Angstroms to about 100 Angstroms, such as about 10 Angstroms to about 50 Angstroms. The dielectric layer 131 may be, for instance, dielectric materials, such as $SiO_2$. MgOx, MgNx, ZnO, SiNx, SiOx, SiON, alloys or layer sequences thereof. In particular examples, the dielectric layer 130 may be silicon nitride. The dielectric layer 131 may be formed using MOCVD process(s), ALD process(s), sputter deposition process(s), or other suitable process(s).

In the example of FIG. 10, the recess 146 may extend all the way through the second cap layer 118 and at least a portion of the first cap layer 116. The recess 146 may have a depth $T_3$ of about 510 Angstroms to about 1050 Angstroms. The recess 146 may allow for the field plate 136 to be located closer to the channel layer 114. For instance, the field plate 136 may be separated a distance $D_6$ from the channel layer 114. In some examples, the distance $D_6$ may be in a range of about 10 Angstroms to about 125 Angstroms. The field plate 136 of FIG. 10 may be connected to the source contact 122 using one or more of the conductive paths described in FIGS. 3 and 4. In some examples, the field plate 136 may be connected to the gate contact or other bias or supply contact. In some examples, the field plate 136 may be floating.

FIG. 11 depicts a cross-sectional view of an example HEMT device 154 according to example embodiments of the present disclosure. FIG. 11 is intended to represent structures for identification and description and is not intended to represent the structures to physical scale. The HEMT device 154 of FIG. 11 is similar to the HEMT device 152 of FIG. 10. The field plate 136 is recessed in a recess 146 defined in the N-polar Group III-nitride semiconductor structure 102. The field plate 136 may be separated from the N-polar Group III-nitride semiconductor structure 102 in the recess 146 by a dielectric layer 131. The dielectric layer 131 may be the same as or different from the dielectric layer 130. The dielectric layer 131 may have a thickness, for instance, of about 5 Angstroms to about 100 Angstroms, such as about 10 Angstroms to about 50 Angstroms. The dielectric layer 131 may be, for instance, dielectric materials, such as $SiO_2$, MgOx, MgNx, ZnO, SiNx, SiOx, SiON, alloys or layer sequences thereof. In particular examples, the dielectric layer 130 may be silicon nitride. The dielectric layer 131 may be formed using MOCVD process(s), ALD process(s), sputter deposition process(s), or other suitable process(s).

In the example of FIG. 11, the recess 146 may extend all the way through the second cap layer 118 and all the way through the second cap layer 118. The recess 146 may have a depth $T_4$ of about 515 Angstroms to about 1100 Angstroms. The recess 146 may allow for the field plate 136 to be located closer to the channel layer 114. For instance, the field plate 136 may be separated a distance $D_7$ from the channel layer 114. In some examples, the distance $D_7$ may be in a range of about 5 Angstroms to about 100 Angstroms, such as about 10 Angstroms to about 50 Angstroms. The field plate 136 of FIG. 11 may be connected to the source contact 122 using one or more of the conductive paths described in FIGS. 3 and 4. In some examples, the field plate 136 may be connected to the gate contact or other bias or supply contact. In some examples, the field plate 136 may be floating.

Figure 12:
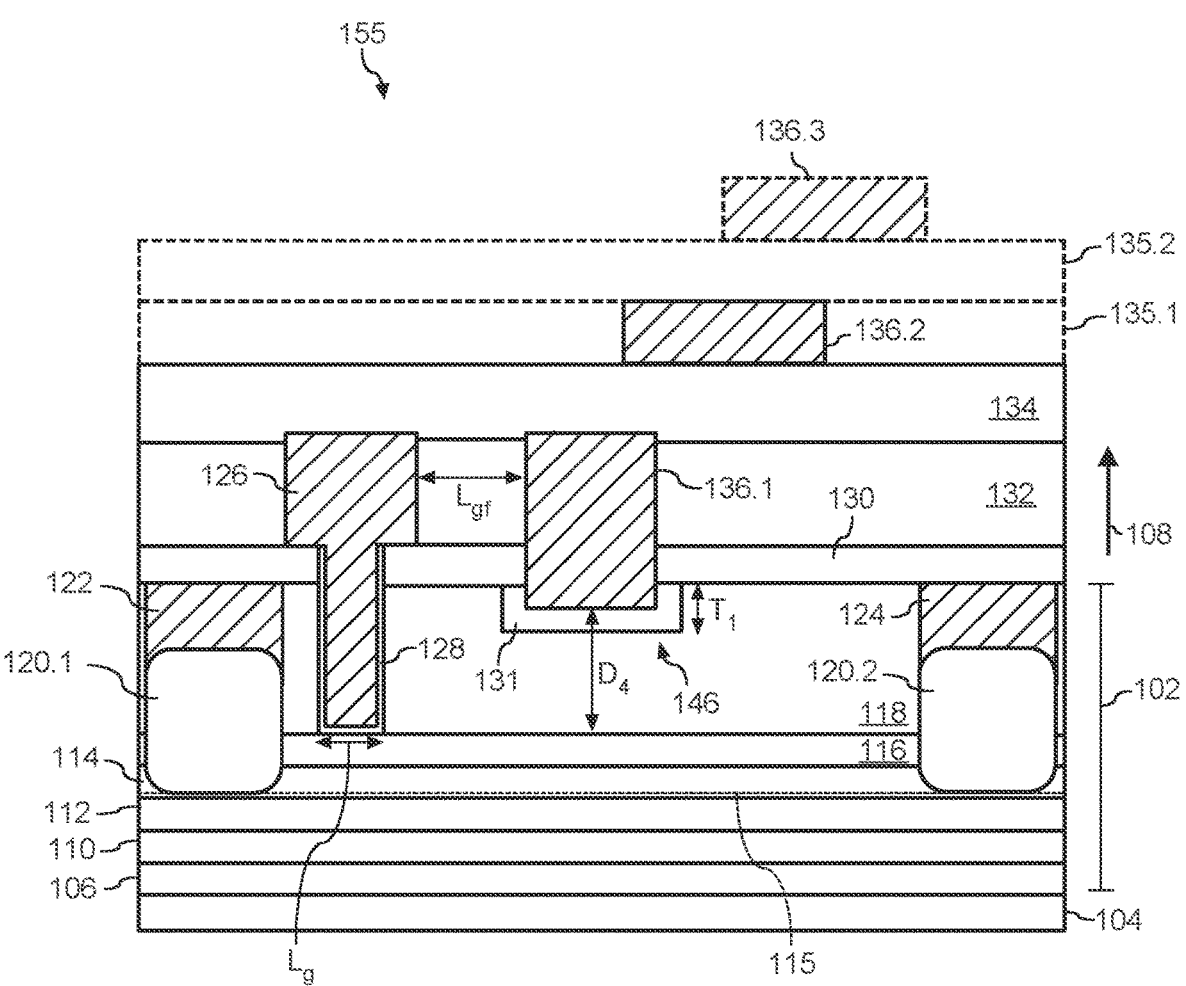
FIG. 12 depicts an example semiconductor device according to example embodiments of the present disclosure.

In some examples, the transistor device may include a plurality of field plates. For example, FIG. 12 depicts a cross-sectional view of an example HEMT device 155 according to example embodiments of the present disclosure. FIG. 12 is intended to represent structures for identification and description and is not intended to represent the structures to physical scale. The HEMT device 155 of FIG. 12 is similar to the HEMT device 148 of FIG. 8. However, the HEMT device 155 has multiple field plates, including a first field plate 136.1, a second field plate 136.2, a third field plate 136.3, etc. The first field plate 136.1 is recessed in a recess 146 defined in the N-polar Group III-nitride semiconductor structure 102. The first field plate 136.1 may be separated from the N-polar Group III-nitride semiconductor structure 102 in the recess 146 by a dielectric layer 131. The dielectric layer 131 may be the same as or different from the dielectric layer 130. The dielectric layer 131 may have a thickness of, for instance, about 5 Angstroms to about 100 Angstroms, such as about 10 Angstroms to about 50 Angstroms. The dielectric layer 131 may be, for instance, dielectric materials, such as $SiO_2$, MgOx, MgNx, ZnO, SiNx, SiOx, SiON, alloys or layer sequences thereof. In particular examples, the dielectric layer 130 may be silicon nitride. The dielectric layer 131 may be formed using MOCVD process(s), ALD process(s), sputter deposition process(s), or other suitable process(s).

In the example of FIG. 12, the recess 146 may extend at least partially into the second cap layer 118. The recess 146 may have a depth $T_1$ of about 100 Angstroms to about 750 Angstroms. The recess 146 may allow for the first field plate 136.1 to be located closer to the channel layer 114. For instance, the field plate 136 may be separated a distance $D_4$ from the channel layer 114. In some examples, the distance $D_4$ may be in a range of about 260 Angstroms to about 1000 Angstroms. The first field plate 136.1 of FIG. 12 may be connected to the source contact 122 using one or more of the conductive paths described in FIGS. 3 and 4. In some examples, the first field plate 136.1 may be connected to the gate contact or other bias or supply contact. In some examples, the first field plate 136.1 may be floating.

As illustrated, the HEMT device 155 may include a second field plate 136.2 positioned overlapping the N-polar Group III-nitride semiconductor structure 102. The second field plate 136.2 may at least partially overlap the first field plate 136.1. A spacer layer 134 (e.g., a dielectric layer 134 may be positioned between the first field plate 136.1 and the second field plate 136.2. The second field plate 136.2 may be the same material as the first field plate 136.1 or may be a different material, such as a different electrically conductive material (e.g., metal). The second field plate 136.2 of FIG. 12 may be connected to the source contact 122 using one or more of the conductive paths described in FIGS. 3 and 4. In some examples, the second field plate 136.2 may be connected to the gate contact or other bias or supply contact. In some examples, the second field plate 136.2 may be floating.

In some examples, as represented by the dashed lines, the HEMT device 155 may include one or more additional field plates, such as a third field plate 136.3. The third field plate 136.3 may be positioned overlapping the N-polar Group III-nitride semiconductor structure 102. The third field plate 136.3 may at least partially overlap the second field plate 136.2 and/or the first field plate 136.1. The second field plate 136.2 may be in an insulating layer 135.1 (e.g., dielectric layer). A spacer layer 135.2 (e.g., a dielectric layer) may be positioned between the second field plate 136.2 and the third field plate 136.3. The insulating layer 135.1 and the spacer layer 135.2 may be, for instance, dielectric materials, such as $SiO_2$, MgOx, MgNx, ZnO, SiNx, SiOx, SiON, alloys or layer sequences thereof and may be formed using MOCVD process(s), ALD process(s), sputter deposition process(s), or other suitable process(s).

The third field plate 136.3 may be the same material as the first field plate 136.1 and/or the second field plate 136.2 or may be a different material, such as a different electrically conductive material (e.g., metal). The third field plate 136.3 of FIG. 12 may be connected to the source contact 122 using one or more of the conductive paths described in FIGS. 3 and 4. In some examples, the third field plate 136.3 may be connected to the gate contact or other bias or supply contact. In some examples, the third field plate 136.3 may be floating.

Figure 13:
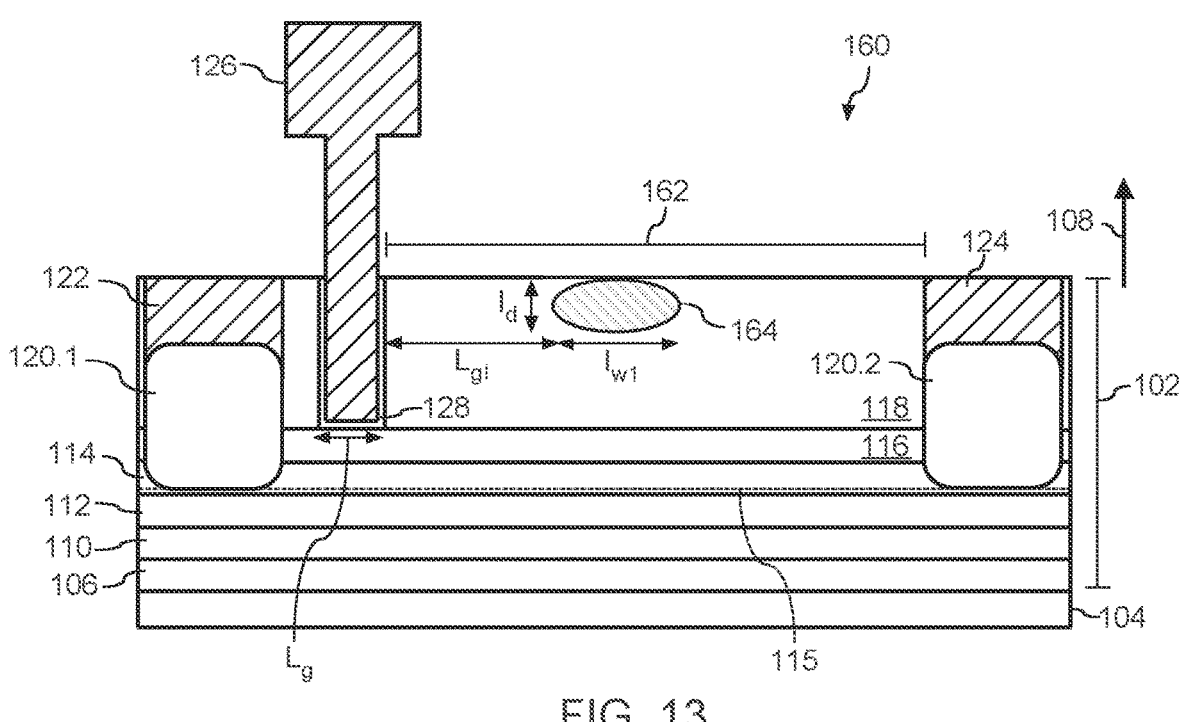
FIG. 13 depicts an example semiconductor device according to example embodiments of the present disclosure.

FIG. 13 depicts a cross-sectional view of an example HEMT device 160 according to example embodiments of the present disclosure. FIG. 13 is intended to represent structures for identification and description and is not intended to represent the structures to physical scale. The HEMT device 160 of FIG. 13 is similar to the HEMT device 100 of FIG. 2. The insulating layers 130, 132, and 134 are not illustrated, but may form a part of the HEMT device 160 in some embodiments. In some examples, the Group III-nitride semiconductor structure 102 may be N-polar. In some examples, the Group III-nitride semiconductor structure 102 may be metal polar.

The HEMT device 160 includes a field reducing structure that includes an implanted region 164 in the Group III-nitride semiconductor structure 102. The implanted region 164 may be in a region 162 in the Group III-nitride semiconductor structure 102 between the gate contact 126 and the drain contact 124 (e.g., a drain access region). The implanted region 164 may be in, for instance, the second cap layer 118. In the example of FIG. 13, the implanted region 164 is not coupled to the drain contact 124.

The implanted region 164 may include a distribution of implanted dopants, such as silicon (Si), magnesium (Mg), fluorine (F), iron (Fe), carbon (C), tin (Sn), oxygen (O), or other dopants. The implanted region 164 may have a peak dopant concentration of less than about $1 \times 10^{18}$ dopants/cm$^3$. The distribution of implanted dopants may extend to a depth $I_D$ beneath a surface of the Group III-nitride semiconductor structure. The depth $I_D$ may be in a range of about 125 Angstroms to about 500 Angstroms. The distribution of implanted dopants of the implanted region 164 may be associated with a width $I_{W1}$ in the drain access region 162. The width $I_{W1}$ may be about 20% or greater of a width of the drain access region 162, such as about 40% or greater. In some examples, the width $I_{W1}$ may be in a range of about 0.3 μm to about 2.0 μm.

In some examples, there can be a distance $L_{GI}$ between the implanted region 164 and the gate contact 126. The distance $L_{GI}$ may be wide enough to isolate the implanted region 164 from the gate contact 126, but small enough to increase the field effect provided by the implanted region 164. In some examples, the distance $L_{GI}$ may be in a range of about 0.4 μm or less, such as in a range of 0.05 μm to about 0.6 μm.

The implanted region 164 may be electrically connected to the source contact 122. In some examples, the implanted region 164 may be connected to the source contact 122 using one or more conductive paths outside of the active area of the HEMT device 160 as described, for instance, with reference to FIG. 4. Instead of connecting a field plate to the source contact 122 with the conductive path 139, the implanted region 164 may be connected to the source contact with the conductive path 139. In some examples, the implanted region 164 may be connected to the gate contact or other bias or supply contact. In some examples, the implanted region 164 may be floating. The implanted region 164 may reduce an electric field in the Group III-nitride semiconductor structure 102 and may act as a field reducing structure similar to a field plate.

Figure 14:
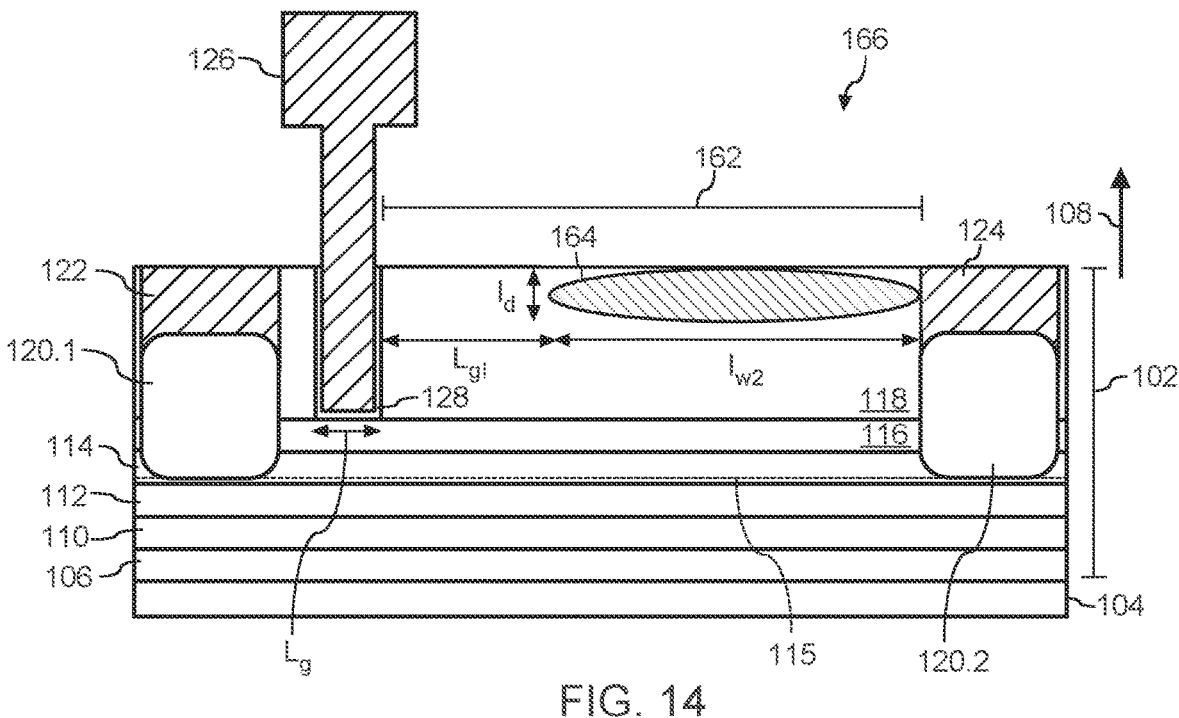
FIG. 14 depicts an example semiconductor device according to example embodiments of the present disclosure.

FIG. 14 depicts a cross-sectional view of an example HEMT device 166 according to example embodiments of the present disclosure. FIG. 14 is intended to represent structures for identification and description and is not intended to represent the structures to physical scale. The HEMT device 166 of FIG. 14 is similar to the HEMT device 160 of FIG. 13. However, in the example of FIG. 14, the implanted region 164 extends through the drain access region 162 such that the implanted region 164 is coupled (e.g., electrically coupled) to the drain contact 124. More particularly, the implanted region 164 has a width $I_{W2}$ such that the implanted region is coupled to the drain contact 124.

The implanted region 164 may include a distribution of implanted dopants, such as silicon (Si), magnesium (Mg), fluorine (F), iron (Fe), carbon (C), tin (Sn), oxygen (O), or other dopants. The implanted region 164 may have a peak dopant concentration of less than about $1 \times 10^{18}$ dopants/cm$^3$. The distribution of implanted dopants may extend to a depth $I_D$ beneath a surface of the Group III-nitride semiconductor structure. The depth $I_D$ may be in a range of about 125 Angstroms to about 500 Angstroms. The distribution of implanted dopants of the implanted region 164 may be associated with a width $I_{W1}$ in the drain access region 162. The width $I_{W2}$ may be about 50% or greater of a width of the drain access region 162, such as about 60% or greater. In some examples, the width $I_{W2}$ may be in a range of about 0.1 μm to about 1 μm.

In some examples, there can be a distance $L_{GI}$ between the implanted region 164 and the gate contact 126. The distance $L_{GI}$ may be wide enough to isolate the implanted region 164 from the gate contact 126, but small enough to increase the field effect provided by the implanted region 164. In some examples, the distance $L_{GI}$ may be in a range of about 0.4 μm or less, such as in a range of 0.05 μm to about 2.0 μm.

The implanted region 164 may be electrically connected to the source contact 122. In some examples, the implanted region 164 may be connected to the source contact 122 using one or more conductive paths outside of the active area of the HEMT device 160 as described, for instance, with reference to FIG. 4. Instead of connecting a field plate to the source contact 122 with the conductive path 139, the implanted region 164 may be connected to the source contact with the conductive path 139. In some examples, the implanted region 164 may be connected to the gate contact or other bias or supply contact. The implanted region 164 may reduce an electric field in the Group III-nitride semiconductor structure 102 and may act as a field reducing structure similar to a field plate.

Figure 15:
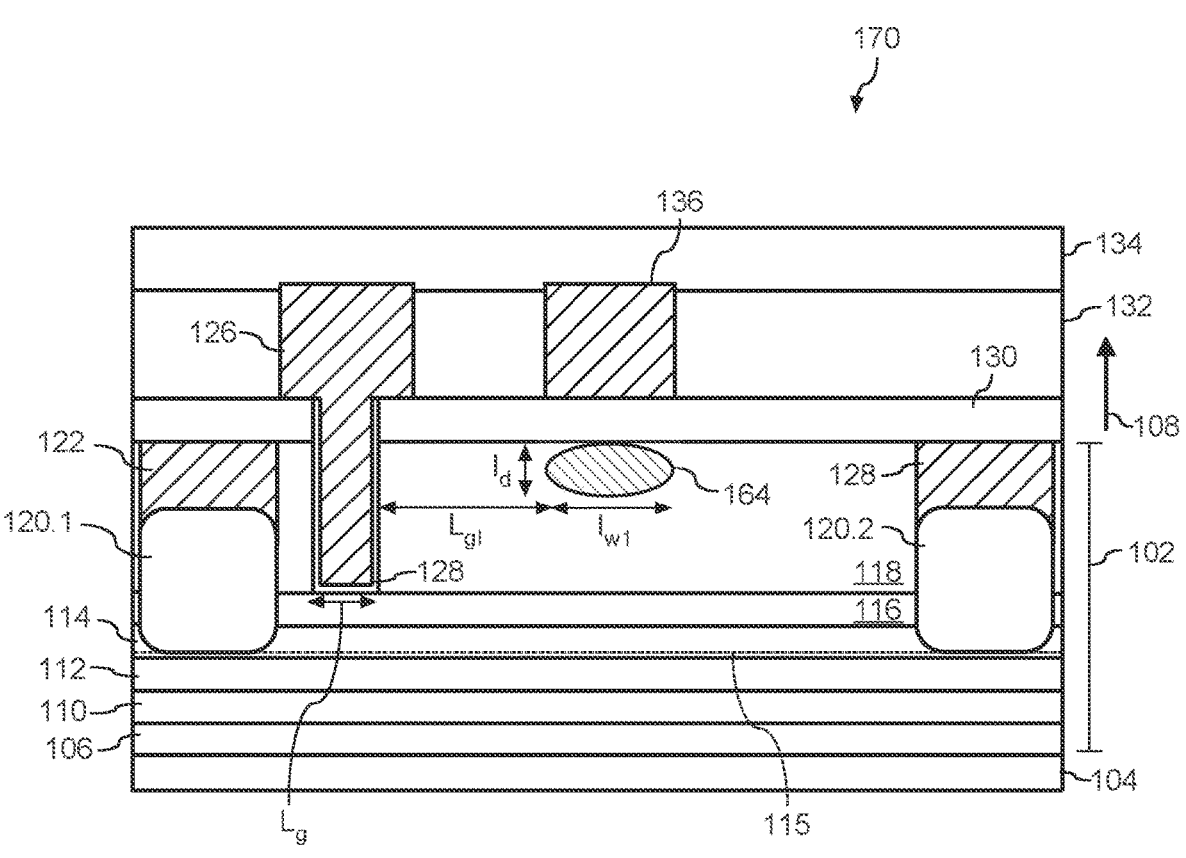
FIG. 15 depicts an example semiconductor device according to example embodiments of the present disclosure.

In some examples, an HEMT device may include a field plate and an implanted region as field reducing structures. For instance, FIG. 15 depicts a cross-sectional view of an example HEMT device 170 according to example embodiments of the present disclosure. FIG. 15 is intended to represent structures for identification and description and is not intended to represent the structures to physical scale. The HEMT device 170 of FIG. 15 is similar to the HEMT device 160 of FIG. 13. However, in addition to the implanted region 164, the HEMT device 170 includes a field plate 136 overlapping the Group III-nitride semiconductor structure 102. The field plate 136 may be similar to any of the field plates described herein. The field plate 136 of FIG. 15 may be connected to the source contact 122 using one or more of the conductive paths described in FIGS. 3 and 4. In some examples, the field plate 136 may be connected to the gate contact or other bias or supply contact. In some examples, the field plate 136 may be floating.

Figures 16, 17:
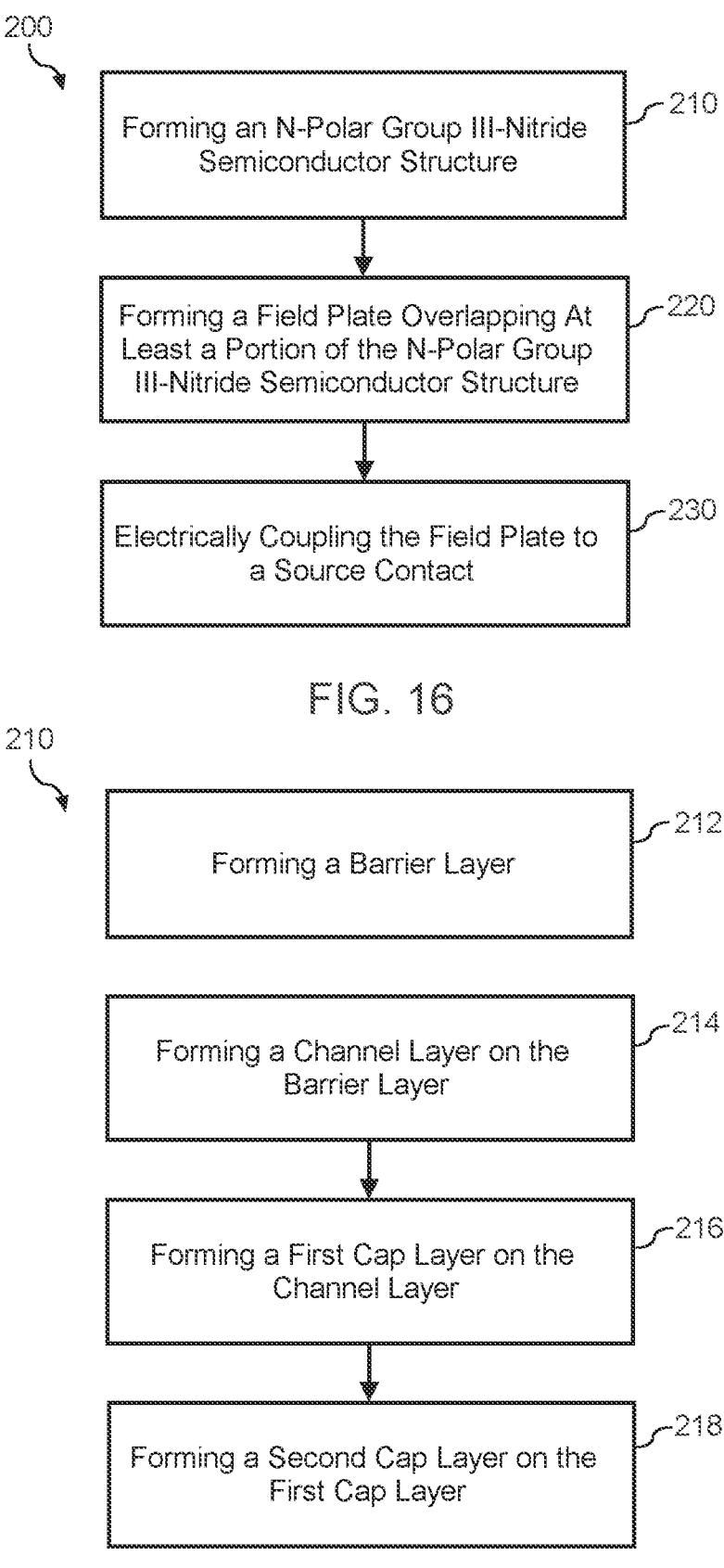
FIG. 16 depicts a flow chart of an example method according to example embodiments of the present disclosure.
FIG. 17 depicts a flow chart of example forming of a nitrogen-polar (N-polar) Group III-nitride semiconductor structure according to example embodiments of the present disclosure.

FIG. 16 depicts a flow chart of an example method 200 according to example embodiments of the present disclosure. FIG. 16 depicts example process steps for purposes of illustration and discussion. Those of ordinary skill in the art, using the disclosures provided herein, will understand that process steps of any of the methods described in the present disclosure may be adapted, modified, include steps not illustrated, omitted, and/or rearranged without deviating from the scope of the present disclosure.

At 210, the method 200 may include forming an N-polar Group III-nitride semiconductor structure. For instance, the method 200 may include forming an N-polar Group III-nitride semiconductor substrate 102 on a substrate 104, such as a silicon carbide substrate 104. The semiconductor structure 102 may be a multilayer structure and may include one or more of a nucleation layer 106, a buffer layer 110, a barrier layer 112, a channel layer 114, a first cap layer 116 and second cap layer 118. Details concerning these example layers are described above with reference to FIG. 2. The N-polar Group III-nitride semiconductor structure may be formed, for instance, using metal-organic chemical vapor deposition (MOCVD), molecular beam epitaxy (MBE), or hydride vapor phase epitaxy (HVPE).

At 220, the method 200 may include forming a field plate overlapping at least a portion of the N-polar Group III-nitride semiconductor structure. For instance, the method 200 may include forming a field plate 136 overlapping the Group III-semiconductor structure 102 as illustrated in FIGS. 2-11. The field plate may be formed using, for instance, a metallization process.

At 230, the method 200 may include electrically coupling the field plate to a source contact. For instance, the method 200 may include coupling the field plate 136 to the source contact 122 using an electrically conductive path as described in FIGS. 3 and 4. In some examples, the field plate may be connected to the gate contact or other bias or supply contact. In some examples, the field plate may be floating.

FIG. 17 depicts a flow chart of forming an N-polar Group III-nitride semiconductor structure 210 according to example embodiments of the present disclosure. FIG. 17 depicts example process steps for purposes of illustration and discussion. Those of ordinary skill in the art, using the disclosures provided herein, will understand that process steps of any of the methods described in the present disclosure may be adapted, modified, include steps not illustrated, omitted, and/or rearranged without deviating from the scope of the present disclosure.

At 212, forming an N-polar Group III-nitride semiconductor structure 210 may include forming a barrier layer. The barrier layer may be formed, for instance, on a channel layer of the N-polar Group III-nitride semiconductor structure. An example barrier layer 112 is described with reference to FIG. 2. The barrier layer may be formed, for instance, using metal-organic chemical vapor deposition (MOCVD), molecular beam epitaxy (MBE), or hydride vapor phase epitaxy (HVPE).

At 214, forming an N-polar Group III-nitride semiconductor structure 210 may include forming a channel layer. The channel layer may be formed, for instance, on the barrier layer. An example channel layer 114 is described with reference to FIG. 2. The channel layer may be formed, for instance, using metal-organic chemical vapor deposition (MOCVD), molecular beam epitaxy (MBE), or hydride vapor phase epitaxy (HVPE).

At 216, forming an N-polar Group III-nitride semiconductor structure 210 may include forming a first cap layer. The first cap layer may be formed, for instance, on the channel layer. An example first cap layer 116 is described with reference to FIG. 2. The first cap layer may be formed, for instance, using metal-organic chemical vapor deposition (MOCVD), molecular beam epitaxy (MBE), or hydride vapor phase epitaxy (HVPE).

At 218, forming an N-polar Group III-nitride semiconductor structure 210 may include forming a second cap layer. The second cap layer may be formed, for instance, on the first cap layer. An example second cap layer 118 is described with reference to FIG. 2. The second cap layer may be formed, for instance, using metal-organic chemical vapor deposition (MOCVD), molecular beam epitaxy (MBE), or hydride vapor phase epitaxy (HVPE).

Figure 18:
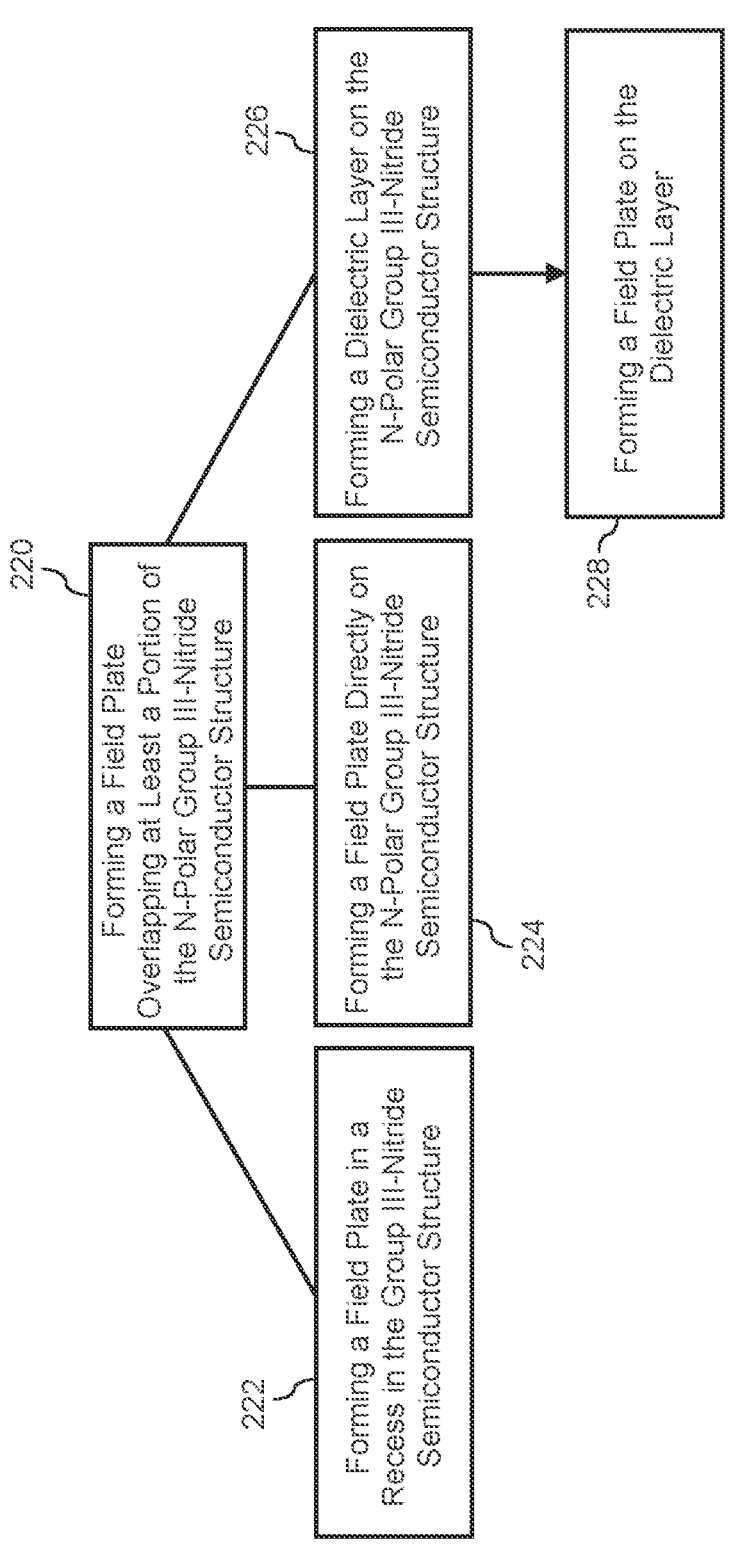
FIG. 18 depicts a flow chart of example forming of a field plate overlapping an N-polar Group III-nitride semiconductor structure according to example embodiments of the present disclosure.

FIG. 18 depicts a flow chart of forming a field plate overlapping at least a portion of the N-polar Group III-nitride semiconductor structure according to example embodiments of the present disclosure. FIG. 18 depicts example process steps for purposes of illustration and discussion. Those of ordinary skill in the art, using the disclosures provided herein, will understand that process steps of any of the methods described in the present disclosure may be adapted, modified, include steps not illustrated, omitted, and/or rearranged without deviating from the scope of the present disclosure.

In one example, at 222, forming a field plate overlapping at least a portion of the N-polar Group III-nitride semiconductor structure 220 may include forming a field plate in a recess in the Group III-nitride semiconductor structure. For instance, a field plate 136 may be formed in a recess 146 in the Group III-nitride semiconductor structure 102 as illustrated in FIGS. 7-12. In some examples, the recess may be in the second cap layer. In some examples, the recess may be in the first cap layer and the second cap layer.

In one example, at 224, forming a field plate overlapping at least a portion of the N-polar Group III-nitride semiconductor structure 220 may include forming the field plate directly on the Group III-nitride semiconductor structure such that the field plate forms a Schottky contact with the N-polar Group III-nitride semiconductor structure. For instance, a field plate 136 may be formed directly on the N-polar Group III-nitride semiconductor structure as illustrated in FIGS. 6 and 7. In some examples, there may be no dielectric layer between the field plate and the N-polar Group III-nitride semiconductor structure.

In one example, at 226, forming a field plate overlapping at least a portion of the N-polar Group III-nitride semiconductor structure 220 may include forming a dielectric layer on the N-polar Group III nitride semiconductor structure. For instance, a dielectric layer 130 and/or a dielectric layer 131 may be formed on the N-polar Group III-nitride semiconductor structure 102 as shown in FIGS. 2-5 and 8-12. The dielectric layer may be formed using, for instance, MOCVD process(s), atomic layer deposition (ALD) process(s), sputter deposition process(s), or other deposition process(s). At 228, forming a field plate overlapping at least a portion of the N-polar Group III-nitride semiconductor structure 220 may include forming a field plate on the dielectric layer.

FIG. 19 depicts a flow chart of an example method 240 according to example embodiments of the present disclosure. FIG. 19 depicts example process steps for purposes of illustration and discussion. Those of ordinary skill in the art, using the disclosures provided herein, will understand that process steps of any of the methods described in the present disclosure may be adapted, modified, include steps not illustrated, omitted, and/or rearranged without deviating from the scope of the present disclosure.

At 242, the method 240 may include forming an N-polar Group III-nitride semiconductor structure. For instance, the method 200 may include forming an N-polar Group III-nitride semiconductor substrate 102 on a substrate 104, such as a silicon carbide substrate 104. The semiconductor structure 102 may be a multilayer structure and may include one or more of a nucleation layer 106, a buffer layer 110, a barrier layer 112, a channel layer 114, a first cap layer 116 and second cap layer 118. Details concerning these example layers are described above with reference to FIG. 2. The N-polar Group III-nitride semiconductor structure may be formed, for instance, using metal-organic chemical vapor deposition (MOCVD), molecular beam epitaxy (MBE), or hydride vapor phase epitaxy (HVPE).

At 244, the method 240 may include implanting dopants in a region of the Group III-nitride semiconductor structure (e.g., an N-polar Group III-nitride semiconductor structure) to form an implanted region. For instance, the method 240 may include implanting dopants to form an implanted region 162 as shown in FIGS. 13-15. The implanted region may include a distribution of implanted dopants, such as silicon (Si), magnesium (Mg), fluorine (F), iron (Fe), carbon (C), tin (Sn), oxygen (O), or other dopants. The implanted region may have a peak dopant concentration of less than about $1 \times 10^{18}$ dopants/cm$^3$. The distribution of implanted dopants may extend to a depth beneath a surface of the Group III-nitride semiconductor structure. The depth may be in a range of about 125 Angstroms to about 500 Angstroms.

At 246, the method may include forming a gate contact and a drain contact on the Group III-nitride semiconductor structure such that the implanted region is between the gate contact and the drain contact. For instance, as illustrated in FIGS. 13-15, the implanted region 164 is in the drain access region 162 between the gate contact 126 and the drain contact 124.

At 248, the method may include electrically coupling the implanted region to the source contact and/or the drain contact of the transistor device. For instance, as shown in FIG. 14, the implanted region 164 may be electrically coupled to the drain contact 124. In some examples, the implanted region 164 may be electrically coupled to the source contact 122 using the conductive path illustrated in FIG. 4. For instance, instead of connecting a field plate to the source contact 122 with the conductive path 139, the implanted region 164 may be connected to the source contact with the conductive path 139 of FIG. 4. In some examples, the implanted region may be connected to the gate contact or other bias or supply contact. In some examples, the implanted region may be floating.

Example aspects of the present disclosure are set forth below. Any of the below features or examples may be used in combination with any of the embodiments or features provided in the present disclosure.

One example aspect of the present disclosure is directed to a transistor device. The transistor device includes a nitrogen-polar (N-polar) Group III-nitride semiconductor structure. The transistor device includes a source contact, a drain contact, and a gate contact. The transistor device includes a field reducing structure operable to reduce an electric field in a region in the N-polar Group III-nitride semiconductor structure between the gate contact and the drain contact.

In some examples, the field reducing structure comprises a field plate overlapping the N-polar Group III-nitride semiconductor structure. In some examples, the field plate is electrically coupled to the source contact.

In some examples, the field plate has a laterally extending portion that overlaps at least a portion of the gate contact. In some examples, the field plate does not overlap the gate contact.

In some examples, the transistor device includes a dielectric layer between the field plate and the N-polar Group III-nitride semiconductor structure. In some examples, the field plate is at least partially recessed into the N-polar Group III-nitride semiconductor structure.

In some examples, the field plate is directly on the Group III-nitride semiconductor structure to form a Schottky contact with the Group III-nitride semiconductor structure. In some examples, the field plate is at least partially recessed into the N-polar Group III-nitride semiconductor structure.

In some example, the N-polar Group III-nitride semiconductor structure comprises a barrier layer and a channel layer on the barrier layer. In some examples, the Group III-nitride semiconductor structure comprises one or more cap layers. In some examples, the field plate is at least partially recessed into the one or more cap layers.

In some examples, the field reducing structure comprises an implanted region in the Group III-nitride semiconductor structure. In some examples, the implanted region is electrically coupled to the source contact. In some examples, the implanted region is electrically coupled to the drain contact.

In some examples, the implanted region comprises a plurality of implanted dopants, the implanted dopants comprising silicon (Si), magnesium (Mg), fluorine (F), iron (Fe), carbon (C), tin (Sn), or oxygen (O). In some examples, the implanted region has a peak dopant concentration of less than about $1 \times 10^{18}$ dopants/cm$^3$.

In some examples, the gate contact has a gate length of about 100 nm or greater.

In some examples, the transistor device comprises a second field plate overlapping the N-polar Group III-nitride semiconductor structure.

In some examples, the transistor device is associated with an operating frequency of less than about 40 GHz.

In some examples, the transistor device further comprises a silicon carbide substrate.

In some examples, the transistor device is a high electron mobility transistor device.

Another example aspect of the present disclosure is directed to a transistor device. The transistor device includes an N-polar Group III-nitride semiconductor structure. The transistor device includes a field plate overlapping the N-polar Group III-nitride semiconductor structure.

In some examples, the N-polar Group III-nitride structure comprises a barrier layer and a channel layer on the barrier layer. In some examples, the barrier layer comprises Al$_w$Ga$_{1-w}$N, where w is in a range of about 0.1 to about 0.4; and the channel layer comprises Al$_x$Ga$_{1-x}$N, where x is less than about 0.1. In some examples, the N-polar Group III-nitride semiconductor structure comprises one or more cap layers on the channel layer. In some examples, the one or more cap layers comprise a first cap layer and a second cap layer, wherein the first cap layer comprises Al$_y$Ga$_{1-y}$N, where y is in a range of about 0.1 to about 0.4, and wherein the second cap layer comprises Al$_z$Ga$_{1-z}$N, where w is in less than about 0.1.

In some examples, the field plate is recessed at least partially into the second cap layer. In some examples, the field plate is recessed at least partially into the first cap layer and the second cap layer. In some examples, the second cap layer has a thickness in a range of about 250 Angstroms to about 1000 Angstroms.

In some examples, the field plate is electrically coupled to a source contact.

In some examples, the field plate has a laterally extending portion that overlaps at least a portion of a gate contact. In some examples, the field plate does not overlap a gate contact.

In some examples, the transistor device comprises a dielectric layer between the field plate and the N-polar Group III-nitride semiconductor structure. In some examples, the field plate is directly on the Group III-nitride semiconductor structure to form a Schottky contact with the Group III-nitride semiconductor structure.

In some examples, the transistor device comprises a gate contact having a gate length of about 100 nm or greater, such as about 150 nm or greater.

In some examples, the transistor device is associated with an operating frequency of less than about 40 GHZ.

In some examples, the transistor device further comprises a silicon carbide substrate.

In some examples, the transistor device is a high electron mobility transistor device.

Yet another example aspect of the present disclosure is directed to a transistor device. The transistor device includes a nitrogen-polar (N-polar) Group III-nitride semiconductor structure. The transistor device includes a source contact, a drain contact, and a gate contact. The transistor device includes an implanted region in the Group III-nitride semiconductor structure in a region between the gate contact and the drain contact.

In some examples, the implanted region is electrically coupled to the source contact. In some examples, the implanted region is electrically coupled to the drain contact.

In some examples, the implanted region comprises a plurality of implanted dopants, the implanted dopants comprising silicon (Si), magnesium (Mg), fluorine (F), iron (Fe), carbon (C), tin (Sn), or oxygen (O). In some examples, the implanted region has a peak dopant concentration of less than about $1 \times 10^{18}$ dopants/cm$^3$.

In some examples, the Group III-nitride semiconductor structure comprises a nitrogen-polar Group III-nitride semiconductor structure. In some examples, the transistor device comprises a barrier layer and a channel layer. In some examples, the barrier layer comprises $Al_wGa_{1-w}N$, where w is in a range of about 0.1 to about 0.4; and the channel layer comprises $Al_xGa_{1-x}N$, where x is less than about 0.1. In some examples, the Group III-nitride semiconductor structure comprises a cap layer. In some examples, the cap layer comprises $Al_zGa_{1-z}N$, where z is less than about 0.1. In some examples, the cap layer has a thickness in a range of about 250 Angstroms to about 1000 Angstroms. In some examples, the implanted region is in the cap layer.

In some examples, the transistor device further comprises a field plate overlapping the Group III-nitride semiconductor structure.

In some examples, the transistor device further comprises a silicon carbide substrate.

In some examples, the transistor device is a high electron mobility transistor device.

Yet another example aspect of the present disclosure is directed to a method of forming a transistor device. The method includes forming an N-polar Group III-nitride semiconductor structure. The method includes forming a field plate overlapping at least a portion of the N-polar Group III-nitride semiconductor structure.

In some examples, forming the N-polar Group III-nitride semiconductor structure comprises: forming a barrier layer, the barrier layer comprises $Al_wGa_{1-w}N$, where w is in a range of about 0.1 to about 0.4; forming a channel layer on the barrier layer, the channel layer comprises $Al_xGa_{1-x}N$, where x is less than about 0.1; forming a first cap layer on the channel layer, the first cap layer comprises $Al_yGa_{1-y}N$, where y is in a range of about 0.1 to about 0.4; and forming a second cap layer on the first cap layer, the second cap layer comprises $Al_zGa_{1-z}N$, where w is in less than about 0.1.

In some examples, forming a field plate comprises forming a field plate in a recess in the second cap layer. In some examples, forming a field plate comprises forming a field plate in a recess in the first cap layer and the second cap layer.

In some examples, forming a field plate comprises forming a dielectric layer on the N-polar Group III-nitride semiconductor structure; and forming the field plate on the dielectric layer. In some examples, forming a field plate comprises forming a field plate directly on the N-polar Group III-nitride semiconductor structure such that the field plate forms a Schottky contact with the N-polar Group III-nitride semiconductor structure.

In some examples, the method further comprises electrically coupling the field plate to a source contact of the transistor device.

Yet another example aspect of the present disclosure is directed to a method of forming a transistor device. The method includes forming a Group III-nitride semiconductor structure. The method includes implanting dopants in a region of the Group III-nitride semiconductor structure to form an implanted region. The method includes forming a gate contact and a drain contact on the Group III-nitride semiconductor structure such that the implanted region is between the gate contact and the drain contact.

In some examples, the method comprises electrically coupling the implanted region to a source contact of the transistor device. In some examples, the method comprises electrically coupling the implanted region to the drain contact of the transistor device.

In some examples, the dopants comprise one or more of silicon (Si), magnesium (Mg), fluorine (F), iron (Fe), carbon (C), tin (Sn), or oxygen (O). In some examples, implanting dopants comprises implanting dopants such that a peak dopant concentration in the implanted region is less than about $1 \times 10^{18}$ dopants/cm$^3$.

In some examples, forming the Group III-nitride semiconductor structure comprises forming an N-polar Group III-nitride semiconductor structure.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A transistor device, comprising:
   a nitrogen-polar (N-polar) Group III-nitride semiconductor structure;
   a source contact, a drain contact, and a gate contact; and
   a field reducing structure operable to reduce an electric field in a region in the N-polar Group III-nitride semiconductor structure between the gate contact and the drain contact;
   wherein the gate contact has a gate length of about 100 nm or greater.

2. The transistor device of claim 1, wherein the field reducing structure comprises a field plate overlapping the N-polar Group III-nitride semiconductor structure.

3. The transistor device of claim 2, wherein the field plate is electrically coupled to the source contact.

4. The transistor device of claim 2, wherein the field plate has a laterally extending portion that overlaps at least a portion of the gate contact.

5. The transistor device of claim 2, wherein the field plate does not overlap the gate contact.

6. The transistor device of claim 2, further comprising a dielectric layer between the field plate and the N-polar Group III-nitride semiconductor structure.

7. The transistor device of claim 6, wherein the field plate is at least partially recessed into the N-polar Group III-nitride semiconductor structure.

8. The transistor device of claim 2, wherein the field plate is directly on the N-polar Group III-nitride semiconductor structure to form a Schottky contact with the N-polar Group III-nitride semiconductor structure.

9. The transistor device of claim 2, wherein the N-polar Group III-nitride semiconductor structure comprises a barrier layer and a channel layer on the barrier layer, and one or more cap layers, wherein the field plate is at least partially recessed into the one or more cap layers.

10. The transistor device of claim 1, wherein the field reducing structure comprises an implanted region in the N-polar Group III-nitride semiconductor structure.

11. The transistor device of claim 10, wherein the implanted region is electrically coupled to the source contact.

12. The transistor device of claim 10, wherein the implanted region is electrically coupled to the drain contact.

13. The transistor device of claim 10, wherein the implanted region comprises a plurality of implanted dopants, the implanted dopants comprising silicon (Si), magnesium (Mg), fluorine (F), iron (Fe), carbon (C), tin (Sn), or oxygen (O).

14. The transistor device of claim 1, wherein the transistor device comprises a second field plate overlapping the N-polar Group III-nitride semiconductor structure.

15. The transistor device of claim 1, wherein the transistor device is associated with an operating frequency of less than about 40 GHz.

16. The transistor device of claim 1, wherein the transistor device further comprises a silicon carbide substrate.

17. The transistor device of claim 1, wherein the transistor device is a high electron mobility transistor device.

18. A transistor device, comprising:

a nitrogen-polar (N-polar) Group III-nitride semiconductor structure;

a field plate overlapping the N-polar Group III-nitride semiconductor structure;

a second field plate overlapping the field plate; and a third field plate overlapping the second field plate.

19. A method of forming a transistor device, comprising:

forming a nitrogen-polar (N-polar) Group III-nitride semiconductor structure;

forming a gate contact having a gate length of about 100 nm or greater; and forming a field plate overlapping at least a portion of the N-polar Group III-nitride semiconductor structure.

* * * * *